US012713986B2

(12) United States Patent
Lu

(10) Patent No.: US 12,713,986 B2
(45) Date of Patent: Aug. 18, 2026

(54) SEMICONDUCTOR DEVICE

(71) Applicant: FUJI ELECTRIC CO., LTD., Kawasaki (JP)

(72) Inventor: Hongfei Lu, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 484 days.

(21) Appl. No.: 18/321,546

(22) Filed: May 22, 2023

(65) Prior Publication Data

US 2023/0299066 A1 Sep. 21, 2023

Related U.S. Application Data

(63) Continuation of application No. PCT/JP2022/008651, filed on Mar. 1, 2022.

(30) Foreign Application Priority Data

Jun. 10, 2021 (JP) ................................ 2021-097355

(51) Int. Cl.
*H10W 90/00* (2026.01)
*H02M 7/537* (2006.01)
*H10W 70/40* (2026.01)

(52) U.S. Cl.
CPC ........... *H10W 90/00* (2026.01); *H02M 7/537* (2013.01); *H10W 70/481* (2026.01); *H10W 90/811* (2026.01); *H10W 90/755* (2026.01)

(58) Field of Classification Search
CPC ............... H01L 25/18; H01L 23/49562; H01L 23/49575; H01L 24/48; H01L 2224/48175;

(Continued)

(56) References Cited

U.S. PATENT DOCUMENTS 5,459,655 A * 10/1995 Mori ................ H03K 17/08148 363/43
7,778,054 B2 8/2010 Sasaya et al.

(Continued)

FOREIGN PATENT DOCUMENTS

JP H03-145755 A 6/1991
JP H05-206449 A 8/1993

(Continued)

OTHER PUBLICATIONS

International Search Report for PCT/JP2022/008651, mailed on May 24, 2022.

*Primary Examiner* — Monica D Harrison
*Assistant Examiner* — David M Helberg
(74) *Attorney, Agent, or Firm* — Rabin & Berdo, P.C.

(57) ABSTRACT

A semiconductor device, including first and second conductive patterns, a plurality of first semiconductor chips each having a switching device, a plurality of second semiconductor chips each having a diode device, a plurality of first wires, respectively coupling low-potential electrodes of the switching devices and the second conductive pattern, and a plurality of second wires, respectively coupling anode electrodes of the diode devices and the second conductive pattern. Lengths of the first and second wires are substantially equal. The first semiconductor chips and the second semiconductor chips are arranged on the first conductive pattern in two rows, each row being in a first direction and including at least one first semiconductor chip and at least one second semiconductor chip, the first direction being parallel to a predetermined side of the first conductive pattern. The first and second wires are each in a second direction orthogonal to the first direction.

15 Claims, 24 Drawing Sheets

(58) Field of Classification Search

CPC ........... H01L 23/3735; H01L 23/49811; H01L 23/5386; H01L 25/072; H01L 24/49; H02M 7/537; H02M 1/0029; H02M 7/003; H02M 7/5387

See application file for complete search history.

(56) References Cited

U.S. PATENT DOCUMENTS

| | | | | |
|---|---|---|---|---|
| 8,669,638 | B2 * | 3/2014 | Boulay | H10W 70/614 257/E29.325 |
| 2013/0001805 | A1 | 1/2013 | Azuma et al. | |
| 2014/0001481 | A1 * | 1/2014 | Michikoshi | H10W 70/468 257/76 |
| 2016/0351505 | A1 | 12/2016 | Tamada et al. | |
| 2019/0326423 | A1 | 10/2019 | Kobayashi | |
| 2022/0302075 | A1 | 9/2022 | Masuda et al. | |

FOREIGN PATENT DOCUMENTS

| | | | | |
|---|---|---|---|---|
| JP | 2002-064180 | A | 2/2002 | |
| JP | 2003142689 | A * | 5/2003 | H01L 24/49 |
| JP | 2005-347561 | A | 12/2005 | |
| JP | 2009-016757 | A | 1/2009 | |
| JP | 4557015 | B2 | 10/2010 | |
| JP | 2013-012560 | A | 1/2013 | |
| JP | 5865422 | B2 | 2/2016 | |
| JP | 2019-192690 | A | 10/2019 | |
| WO | 2015/121899 | A1 | 8/2015 | |
| WO | 2021/014692 | A1 | 1/2021 | |

* cited by examiner

20
C12 (SW12+BD12)
Y1
A
32
C21 (D21)
31
60
70
W12 (L12)
W21 (L21)
35
32b
31a
32a
31b
IN1
W22 (L22)
S1
W11
C22 (D22)
C11 (SW11+BD11)
P
C32 (SW32+BD32)
C41 (D41)
W32 (L22)
W41
34b
34a
IN2
N (S2)
36
C42 (D42)
C31 (SW31+BD31)
M
W42 (L42)
W31 (L31)
34
33
X
Y
Z

| | L11 | L12 | L21 | L22 | COMMON CONDITIONS |
|---|---|---|---|---|---|
| EXAMPLE 1 | 3 [nH] | 3 [nH] | 3 [nH] | 3 [nH] | L11=L31, L12=L32, L21=L41, L22=L42, Ls1=Ls2=1nH |
| EXAMPLE 2 | 1 [nH] | 3 [nH] | 1 [nH] | 3 [nH] | |
| COMPARATIVE EXAMPLE 1 | 3 [nH] | 3 [nH] | 1 [nH] | 1 [nH] | |

FIG. 8

| | ΔL | Lmid | INDIVIDUAL CONDITIONS | COMMON CONDITIONS |
|---|---|---|---|---|
| EXAMPLE 3 | L11-L12 | 3nH, 4nH | L11=L21, L12=L22 | L11=L31, L12=L32, L21=L41, L22=L42, Ls1=Ls2=1nH |
| COMPARATIVE EXAMPLE 2 | L21-L11 | 3nH, 4nH | L11=L12, L21=L22 | |

FIG. 13

SEMICONDUCTOR DEVICE

CROSS-REFERENCE TO RELATED APPLICATIONS

This is a continuation application of International Patent Application No. PCT/JP2022/008651 filed Mar. 1, 2022, which claims the benefit of priority to Japanese Patent Application No. 2021-097355 filed Jun. 10, 2021, the entire contents of each of which are incorporated herein by reference.

BACKGROUND

Technical Field

The present disclosure relates to a semiconductor device.

Description of the Related Art

A bridge circuit is a circuit that includes an upper arm switching device and a lower arm switching device, to drive a load (e.g., Japanese Patent Nos. 4557015 and 5865422).

For example, when a lower arm metal-oxide-semiconductor field effect transistor (MOSFET) is turned off, current flowing through the lower arm MOSFET generally flows through a body diode of an upper arm MOSFET and through a free-wheeling diode coupled to the upper arm MOSFET.

In Japanese Patent No. 5865422, the inductance on the source side of the MOSFET is greater than the inductance on the anode side of a Schottky barrier diode. In such a case, more free-wheeling current flows toward the free-wheeling diode than the body diode of the MOSFET. Thus, the current flowing through the body diode of the MOSFET can be suppressed.

However, in this case, a voltage drop due to the inductance on the source side of the MOSFET lowers a substantial gate-source voltage of the MOSFET, resulting in a decrease in switching speed.

In Japanese Patent No. 4557015, the inductance on the source side of the MOSFET is smaller than the inductance on the anode side of the Schottky barrier diode. In such a case, it is possible to suppress a decrease in switching speed that is caused by a voltage drop due to the inductance on the source side.

However, an increase in the current flowing through the body diode of the MOSFET may accelerate deterioration of the MOSFET.

SUMMARY

An aspect of the present disclosure is a semiconductor device comprising: a first conductive pattern; a second conductive pattern; a plurality of first semiconductor chips, each first semiconductor chip having a front face, a back face that is coupled to the first conductive pattern, and a switching device formed in said each first semiconductor chip, the switching device having a high-potential electrode at the back face and a low-potential electrode at the front face; a plurality of second semiconductor chips, each second semiconductor chip having a front face, a back face that is coupled to the first conductive pattern, and a diode device formed in said each second semiconductor chip, the diode device having a cathode electrode at the back face thereof and an anode electrode at the front face thereof; a plurality of first wires, respectively coupling the low-potential electrodes of the plurality of switching devices and the second conductive pattern; and a plurality of second wires, respectively coupling the anode electrodes of the plurality of diode devices and the second conductive pattern, each of the plurality of second wires having a length substantially equal to a length of each of the plurality of first wires, wherein the plurality of first semiconductor chips and the plurality of second semiconductor chips are arranged on the first conductive pattern in two rows, each row being in a first direction and including at least one of the plurality of first semiconductor chips and at least one of the plurality of second semiconductor chips, the first direction being parallel to a predetermined side of the first conductive pattern, and the plurality of first wires and the plurality of second wires are each in a second direction orthogonal to the first direction. Other features of the present disclosure will become apparent from the description in the present specification and the accompanying drawings.

BRIEF DESCRIPTION OF THE DRAWINGS

FIG. 8 is a table for explaining calculation conditions.

FIG. 13 is a table for explaining calculation conditions.

DETAILED DESCRIPTION

First Embodiment

<Electronic Circuit>

Figure 1:
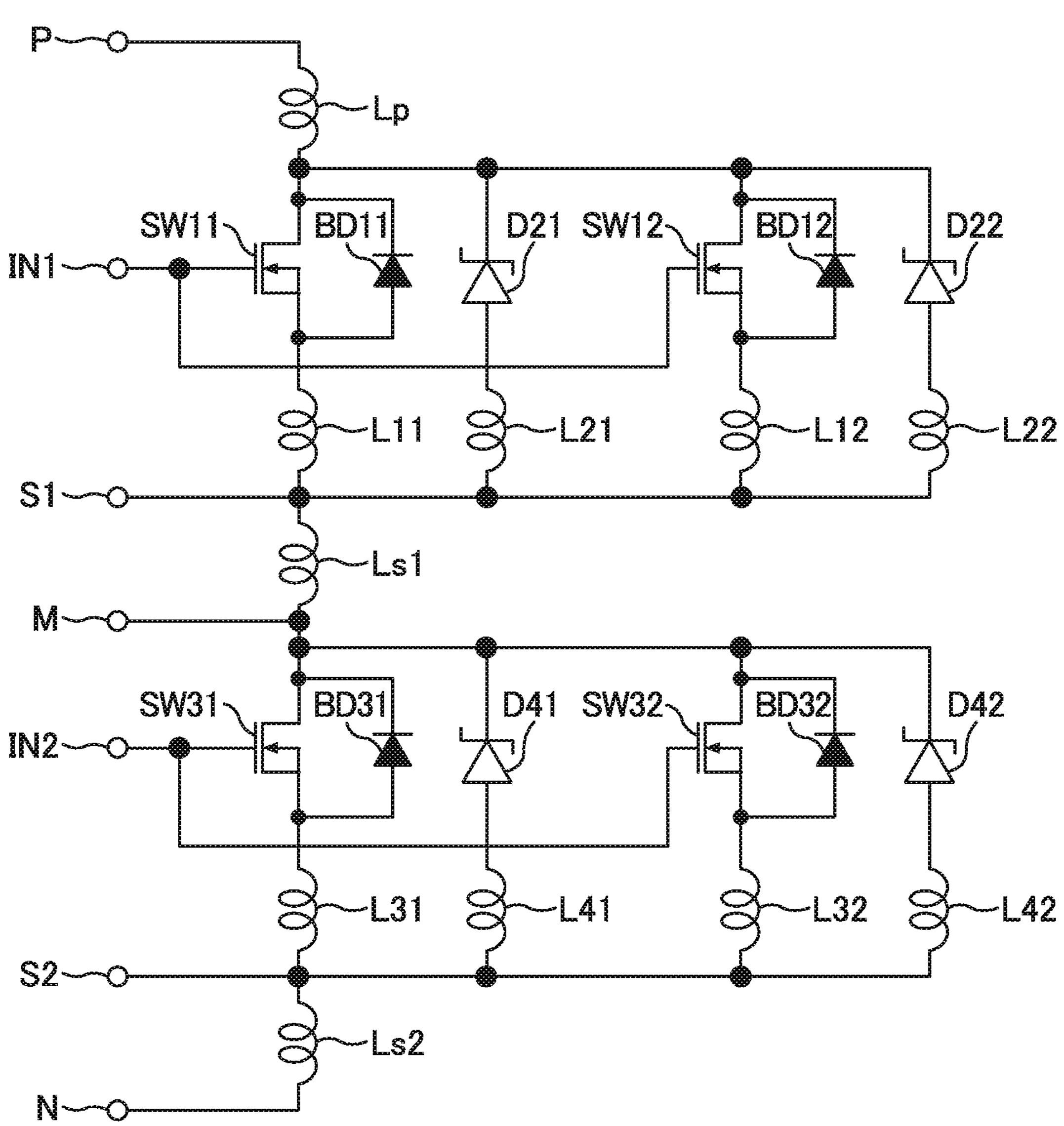
FIG. 1 is a diagram illustrating an electronic circuit.

FIG. 1 is a diagram illustrating an example of an electronic circuit 10 according to an embodiment of the present disclosure. The electronic circuit 10 is a half-bridge circuit to drive a load (not illustrated) such as a motor coil. The electronic circuit 10 includes two upper arm switching devices SW11 and SW12, two lower arm switching devices SW31 and SW32, two upper arm diode devices D21 and D22, and two lower arm diode devices D41 and D42.

The electronic circuit 10 further includes a positive terminal P, an output terminal M, a negative terminal N, a first control terminal IN1, a second control terminal IN2, a first connection terminal S1, and a second connection terminal S2.

The positive terminal P is a terminal on a high potential side, the negative terminal N is a terminal on a low potential side, and the output terminal M is a terminal to which a load is coupled. Although it is assumed in an embodiment of the present disclosure that the negative terminal N is grounded, the output terminal M may be grounded.

A signal for controlling switching of the upper arm switching devices SW11 and SW12 is inputted to the first control terminal IN1. A signal for controlling switching of the lower arm switching devices SW31 and SW32 is inputted to the second control terminal IN2.

In this specification, the two upper arm switching devices SW11 and SW12 are collectively referred to as "switching devices SW1" when there is no need for distinction therebetween. Likewise, the two lower arm switching devices SW31 and SW32 are collectively referred to as "switching devices SW3" when there is no need for distinction therebetween. Further, the two upper arm diode devices D21 and D22 are collectively referred to as "diode devices D2" when there is no need for distinction therebetween. Likewise, the two lower arm diode devices D41 and D42 are collectively referred to as "diode devices D4" when there is no need for distinction therebetween.

The same applies when the number of each of the switching devices SW1, the switching devices SW3, the diode devices D2, and the diode devices D4 is other than two.

The upper arm switching device SW1 and the lower arm switching device SW3 are collectively referred to as "switching device SW" when there is no need for distinction therebetween. Likewise, the upper arm diode device D2 and the lower arm diode device D4 are collectively referred to as "diode device D" when there is no need for distinction therebetween.

The switching device SW has a control electrode, a low-potential electrode, and a high-potential electrode. Since the switching device SW according to an embodiment of the present disclosure is a metal-oxide-semiconductor field effect transistor (MOSFET), the control electrode is a gate electrode, the high-potential electrode is a drain electrode, and the low-potential electrode is a source electrode.

The switching devices SW11, SW12, SW31, and SW32 include diodes BD11, BD12, BD31, and BD32, respectively, as parasitic diodes (i.e., body diodes). In the switching device SW, a cathode electrode of the parasitic diode BD is substantially the same as the drain electrode of the MOSFET, and an anode electrode of the parasitic diode BD is substantially the same as the source electrode of the MOSFET.

The switching device SW1*l* and the switching device SW12 are coupled in parallel with each other. The switching device SW1 has its gate electrode (control electrode) coupled to the first control terminal IN1, its source electrode coupled to the first connection terminal S1, and its drain electrode coupled to the positive terminal P.

A wiring coupling the source electrode of the switching device SW11 and the first connection terminal S1 has an inductance L11 as a parasitic inductance. A wiring coupling the source electrode of the switching device SW12 and the first connection terminal S1 has an inductance L12 as a parasitic inductance.

The diode device D functions as a free-wheeling diode. The diode device D has a cathode electrode and an anode electrode. As the diode device D, a Schottky barrier diode (SBD), a p-intrinsic-n (PIN) diode, or the like can be used. The diode device D according to an embodiment of the present disclosure is a Schottky barrier diode.

The diode devices D21 and D22 are coupled in parallel with each other. The diode device D21 and the switching device SW11 are coupled in inverse-parallel with each other. The diode device D22 and the switching device SW12 are coupled in inverse-parallel with each other. The diode devices D21 and D22 have their anode electrodes coupled to the first connection terminal S1, and their cathode electrodes coupled to the positive terminal P.

The wiring coupling the anode electrode of the diode device D21 and the first connection terminal S1 has an inductance L21 as a parasitic inductance. The wiring coupling the anode electrode of the diode device D22 and the first connection terminal S1 has an inductance L22 as a parasitic inductance.

The wiring coupling the first connection terminal S1 and the output terminal M has an inductance Ls1 as a parasitic inductance.

Although the details will be described later, the inductances L11 and L21 are designed to be substantially equal. Here, the inductances being "substantially equal" means that a difference in inductance therebetween is within the range of manufacturing variation.

When the inductance L11 is larger than the inductance L21, the free-wheeling current flowing through the body diode BD11 can be suppressed. However, in this case, a substantial gate-source voltage of the switching device SW1*l* drops due to the inductance L11, resulting in a decrease in switching speed of the switching device SW11.

In contrast, when the inductance L21 is larger than the inductance L11, such a decrease in switching speed of the switching device SW11 can be prevented. However, the free-wheeling current flowing through the body diode BD11 increases.

Accordingly, by setting the inductances L11 and L21 to be substantially equal, both an increase in free-wheeling current flowing through the body diode BD11 and a decrease in switching speed of the switching device SW11 can be suppressed.

For the same reason, the inductances L12 and L22 are designed to be substantially equal. Likewise, the inductances L11 and L12 are also designed to be substantially equal. That is, the inductances L11, L21, L12, and L22 are designed to be substantially equal.

The coupling relationship between the lower arm switching device SW3 and the lower arm diode device D4 is equivalent to the coupling relationship between the upper arm switching device SW1 and the upper arm diode device D2 described above. Thus, explanation of overlapping parts is omitted.

The switching device SW3 has its gate electrode (control electrode) coupled to the second control terminal IN2, its source electrode coupled to the negative terminal N, and its drain electrode coupled to the output terminal M. A second connection terminal S2 is provided between the source electrode of the switching device SW3 and the negative terminal N.

A wiring coupling the source electrode of the switching device SW31 and the second connection terminal S2 has an inductance L31. A wiring coupling the source electrode of the switching device SW32 and the second connection terminal S2 has an inductance L32.

A wiring coupling the anode electrode of the diode device D41 and the second connection terminal S2 has an inductance L41. A wiring coupling the anode electrode of the diode device D42 and the second connection terminal S2 has an inductance L42.

For the same reason as in the explanation of the upper arm, by setting the inductances L31 and L41 to be substantially equal, both an increase in free-wheeling current flowing through the body diode BD31 and a decrease in switching speed of the switching device SW41 can be suppressed.

For the same reason, the inductances L32 and L42 are designed to be substantially equal. Likewise, the inductances L31 and L32 are also designed to be substantially equal. That is, the inductances L31, L41, L32, and L42 are designed to be substantially equal.

The wiring coupling the second connection terminal S2 and the negative terminal N has an inductance Ls2 as a parasitic inductance.

[Semiconductor Device]

Figure 2:
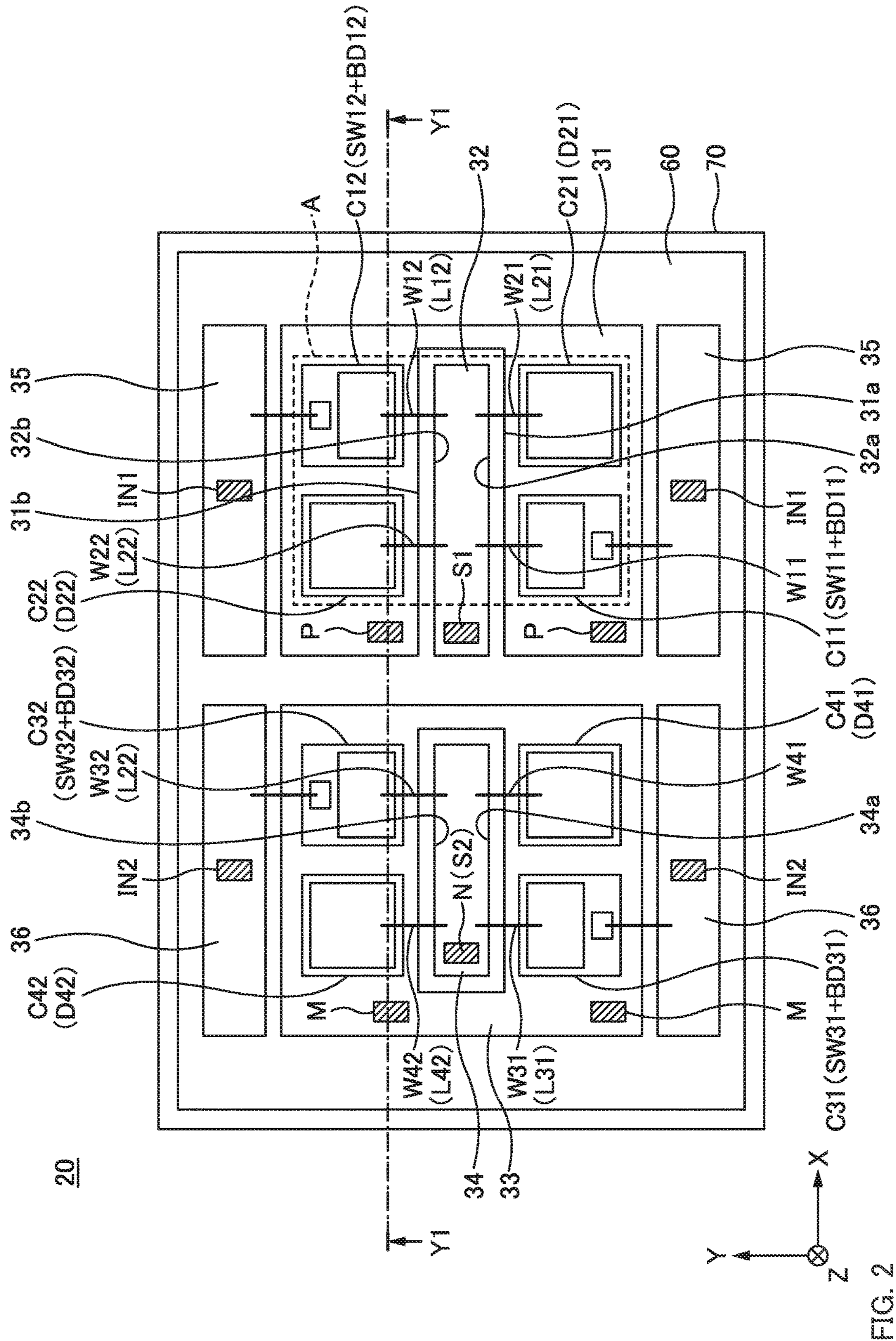
FIG. 2 is a diagram for explaining a configuration of a semiconductor device.
Figure 3:
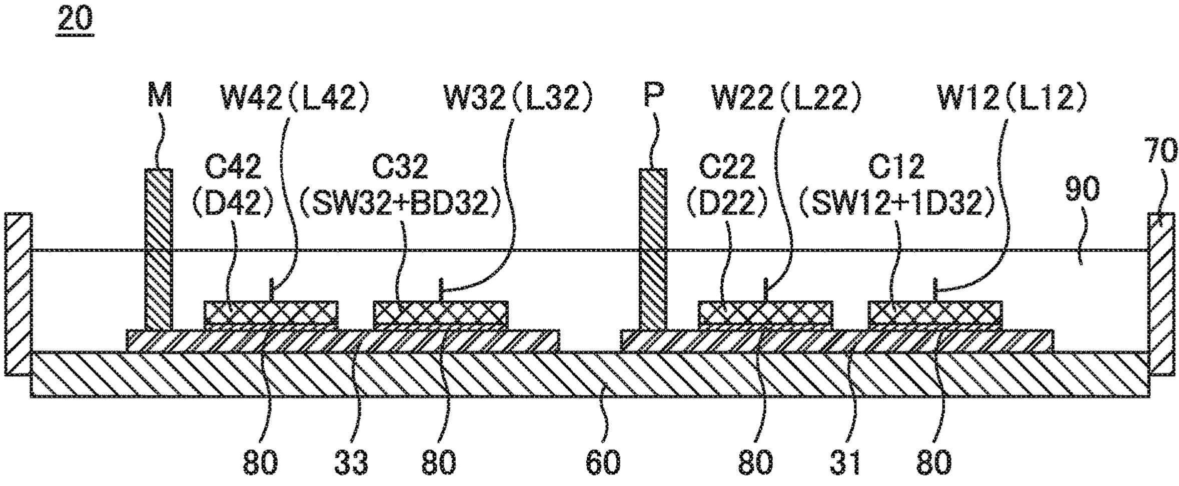
FIG. 3 is a cross-sectional view illustrating a configuration of a semiconductor device.

FIG. 2 is a schematic plan view illustrating a semiconductor device 20 according to an embodiment of the present disclosure. FIG. 3 is a cross-sectional view illustrating the semiconductor device 20 according to an embodiment of the present disclosure. The semiconductor device 20 according to an embodiment of the present disclosure is an example of a semiconductor device that embodies the electronic circuit 10 of FIG. 1. In the following description, a rectangular coordinate system is used, consisting of x-, y-, and z-axes illustrated in FIGS. 2 and 3, which are orthogonal to each other. The positive direction of the x-axis corresponds to a "first direction", while the positive direction of the y-axis corresponds to a "second direction".

Figure 4:
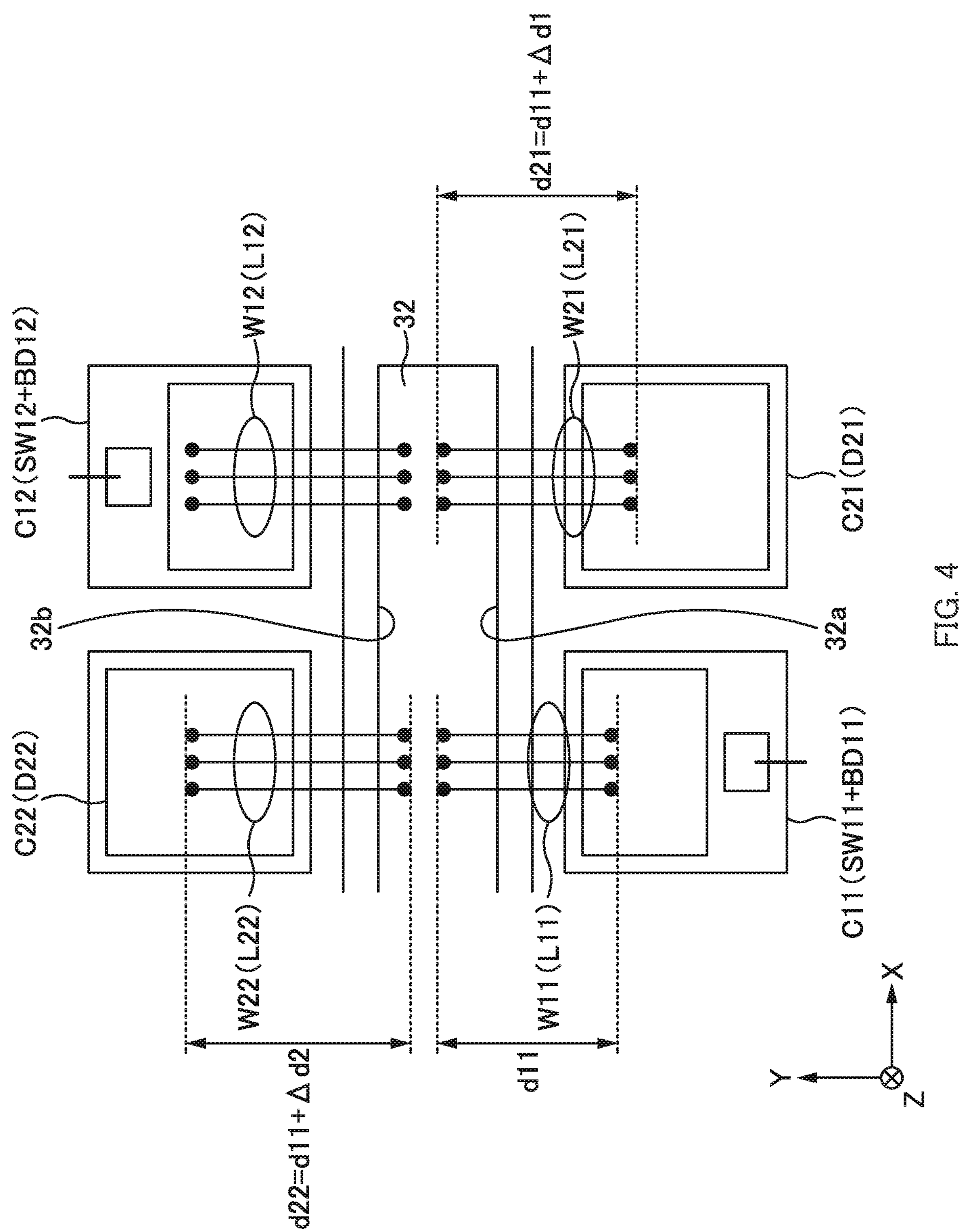
FIG. 4 is an enlarged view for explaining details of wires.
Figures 5A, 5B:
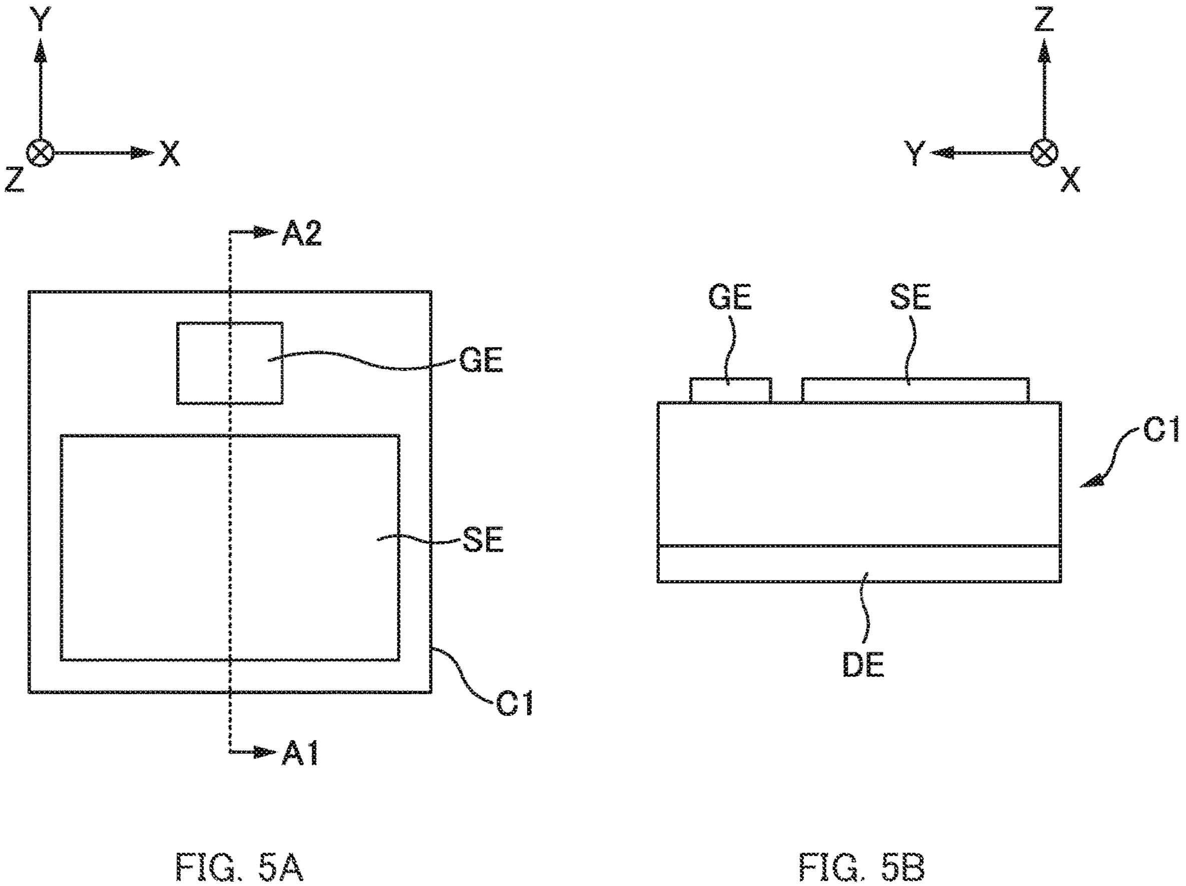
FIG. 5A is a diagram for explaining a configuration of a first semiconductor chip.
FIG. 5B is a diagram for explaining a configuration of a first semiconductor chip.
Figures 6A, 6B:
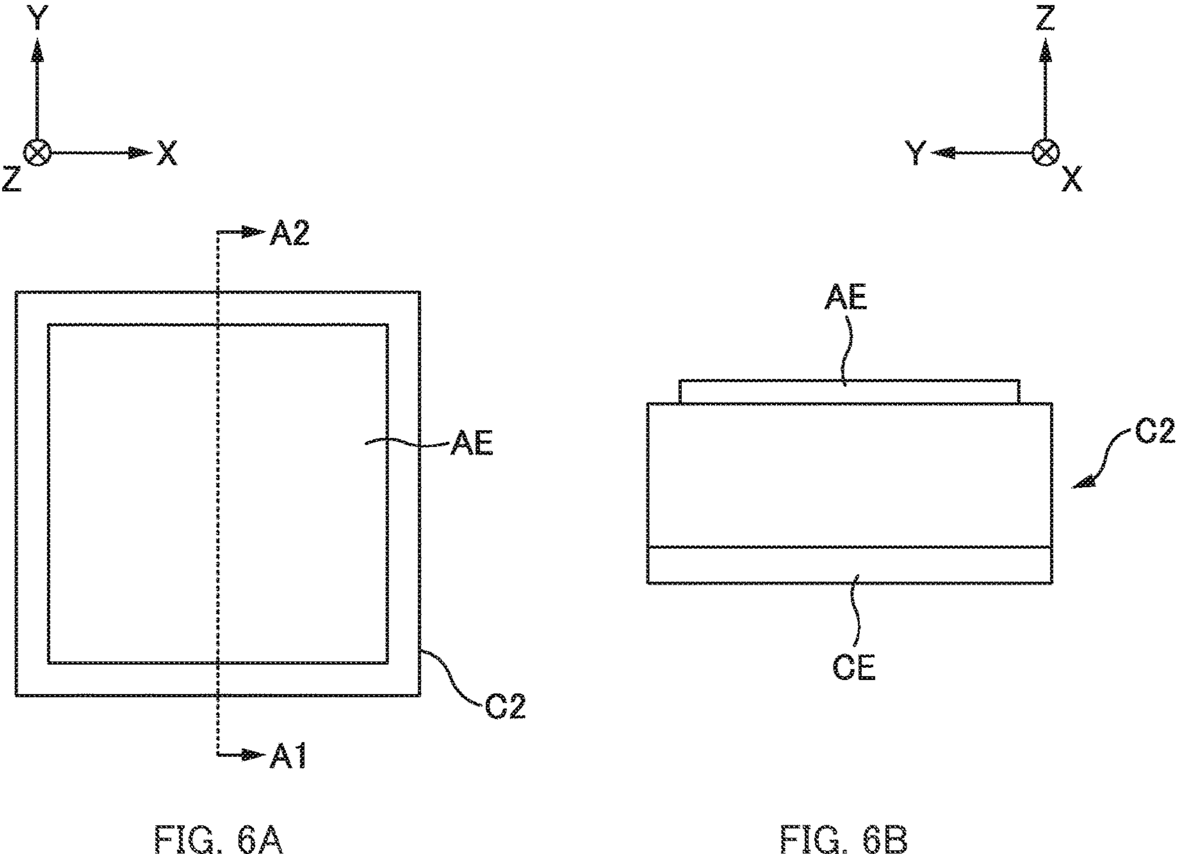
FIG. 6A is a diagram for explaining a configuration of a second semiconductor chip.
FIG. 6B is a diagram for explaining a configuration of a second semiconductor chip.

FIG. 4 is an enlarged view for explaining details of wires according to an embodiment of the present disclosure. FIGS. 5A and 5B are diagrams for explaining a configuration of a first semiconductor chip C1. FIGS. 6A and 6B are diagrams for explaining a configuration of a second semiconductor chip C2.

Hereinafter, in an embodiment of the present disclosure, "joining" means that a configuration E1 and a configuration E2 are mechanically and electrically coupled directly or via a joining material (e.g., solder), and is also simply referred to as "coupling".

The semiconductor device 20 according to an embodiment of the present disclosure includes a first conductive pattern 31, a second conductive pattern 32, a third conductive pattern 33, and a fourth conductive pattern 34. These conductive patterns are collectively referred to simply as "conductive patterns" when there is no need for distinction thereamong.

The semiconductor device 20 also includes a positive terminal P, an output terminal M, a negative terminal N, a first control terminal IN1, a second control terminal IN2, a first connection terminal S1, and a second connection terminal S2. These terminals are collectively referred to simply as "terminals" when there is no need for distinction thereamong.

The semiconductor device 20 also includes two first semiconductor chips C11 and C12, two second semiconductor chips C21 and C22, two third semiconductor chips C31 and C32, and two fourth semiconductor chips C41 and C42.

The semiconductor device 20 further includes first wires W11 and W12, second wires W21 and W22, third wires W31 and W32, and fourth wires W41 and W42.

In this specification, the two first semiconductor chips C11 and C12 are collectively referred to as "first semiconductor chips C1" when there is no need for distinction therebetween. The two second semiconductor chips C21 and C22 are collectively referred to as "second semiconductor chips C2" when there is no need for distinction therebetween. The two third semiconductor chips C31 and C32 are collectively referred to as "third semiconductor chips C3" when there is no need for distinction therebetween. The two fourth semiconductor chips C41 and C42 are collectively referred to as "fourth semiconductor chips C4" when there is no need for distinction therebetween.

The same applies regardless of the number of the first to fourth semiconductor chips C1 to C4.

Likewise, the first wires W11 and W12 are collectively referred to as "first wires W1" when there is no need for distinction therebetween. The second wires W21 and W22 are collectively referred to as "second wires W2" when there is no need for distinction therebetween. The third wires W31 and W32 are collectively referred to as "third wires W3" when there is no need for distinction therebetween. The fourth wires W41 and W42 are collectively referred to as "fourth wires W4" when there is no need for distinction therebetween. The first to fourth wires W1 to W4 are collectively referred to simply as "wires" when there is no need for distinction thereamong.

The same applies regardless of the number of the first to fourth wires W1 to W4.

The semiconductor device 20 further includes a substrate 60 to support the conductive patterns, terminals, first to fourth semiconductor chips C1 to C4, wires, and the like described above.

The semiconductor device 20 further includes a case 70 to house the substrate 60, conductive patterns, terminals, first to fourth semiconductor chips C1 to C4, wires, and the like described above.

The semiconductor device 20 further includes a sealing resin 90 to seal the conductive patterns, terminals, first to fourth semiconductor chips C1 to C4, wires, and the like described above. In FIG. 2, the sealing resin 90 is omitted.

First, an upper arm configuration of the semiconductor device 20 will be described. Then, a lower arm configuration will be described, however, a description of parts or elements that are the same as those of the upper arm configuration is omitted, and differences therebetween will be mainly described.

<<Upper Arm>>

<Conductive Pattern>

The conductive pattern is made of copper, aluminum, or an alloy containing them, for example. The conductive pattern preferably has a thickness of 0.15 mm or more, to minimize the inductance due to the conductive pattern. Further, considering manufacturing cost, the conductive pattern may have a thickness of 2.5 mm or less.

The first conductive pattern 31 corresponds to wiring for electrically connecting the drain electrode of the upper arm switching device SW1 and the cathode electrode of the upper arm diode device D1 to the positive terminal P in the electronic circuit 10 of FIG. 1.

The inductances are generally different among the respective paths from the drain electrode of the switching device SW11, the drain electrode of the switching device SW12, the cathode electrode of the diode device D21, and the cathode electrode of the diode device D22 to the positive terminal P.

The thicker the first conductive pattern 31, the smaller the difference in inductance due to the difference among the paths. Thus, with the thickness of the first conductive pattern 31 being set to 0.15 mm or more, for example, it is possible to sufficiently reduce the difference in inductance due to the difference among the paths in the first conductive pattern 31, as compared with a difference in inductance due to variations in the wires W, which will be described later in detail.

However, the following description is given assuming, for the sake of convenience, that the first conductive pattern 31 has a predetermined inductance as a parasitic inductance in the paths described above.

The second conductive pattern 32 corresponds to a part of wiring for electrically connecting the source electrode of the upper arm switching device SW1 and the anode electrode of the upper arm diode device D1 in the electronic circuit 10 of FIG. 1 to the first connection terminal S1 and the output terminal M (to be described later). The second conductive pattern 32 has an inductance Ls1 as a parasitic inductance.

The fifth conductive pattern 35 corresponds to wiring for electrically connecting the gate electrode of the upper arm switching device SW1 to the first control terminal IN1 in the electronic circuit 10.

A layout relationship between the first and second conductive patterns 31 and 32 will be described. In an embodiment of the present disclosure, the second conductive pattern 32 has a rectangular shape in top view. The second conductive pattern 32 has two sides 32*a* and 32*b* along the x-axis direction.

The "rectangular shape" refers to a shape having four sides, such as a square and a rectangle, for example, and may have at least one corner thereof subjected to chamfering such as C-chamfering or R-chamfering, for example. The "rectangular shape" may also have a notch (recessed portion) or protrusion (projecting portion) provided in a part of its sides. In other words, the "rectangular shape" is a shape including a substantially quadrilateral shape.

The predetermined sides 31*a* and 31*b* of the first conductive pattern 31 are sides parallel to the x-axis. The term "parallel" also includes "substantially parallel" because manufacturing variations and the like occur in practice during formation of the first conductive pattern 31.

The first conductive pattern 31 is formed so as to sandwich at least one side 32*a* along the x-axis direction of the second conductive pattern 32 and the other side 32*b* on the opposite side. The first conductive pattern 31 may be formed so as to surround three sides of the second conductive pattern 32. The first conductive pattern 31 has a U shape in top view.

<Terminal>

The terminal has a plate-like shape, prismatic shape, or cylindrical shape, for example, and has its one end joined to the conductive pattern, and the other end extending from the semiconductor device 20 and electrically coupled to an external device (not illustrated). The terminal is made of copper, aluminum, or an alloy containing them, for example. The one end of the terminal does not necessarily have to be directly joined to the conductive pattern, but may also be electrically coupled through a joining member such as solder, or electrically coupled through a wiring member such as a wire.

The positive electrode terminal P has one end joined to the first conductive pattern 31 and the other end electrically coupled to a positive electrode of a power supply (not illustrated). The output terminal M has one end joined to the third conductive pattern 33 (to be described later) and the other end electrically coupled to a load (not illustrated). The negative electrode terminal N has one end joined to the fourth conductive pattern 34 (to be described later) and the other end electrically coupled to a negative electrode of the power supply (not illustrated). The first connection terminal S1 has one end joined to the second conductive pattern 32 and the other end electrically coupled to a control device (not illustrated). The first control terminal IN1 has one end joined to the fifth conductive pattern 35 and the other end electrically coupled to a signal terminal of the control device (not illustrated). The second control terminal IN2 has one end joined to the sixth conductive pattern 36 and the other end electrically coupled to a signal terminal of the control device (not illustrated).

The output terminal M arranged in the second conductive pattern 32 is coupled to the output terminal M arranged in the third conductive pattern 33 to be described later by metal wiring (not illustrated). Thus, the second conductive pattern 32 is electrically coupled to the third conductive pattern 33.

<Semiconductor Chip>

The semiconductor chip has a rectangular shape in top view, and has a front face and a back face opposite to the front face. The front face may have wires (to be described later) joined thereto. The back face is joined to the conductive pattern through a joining material such as solder.

The switching device SW1 is formed in the first semiconductor chip C1. The switching device SW1 includes a parasitic diode BD. In the switching device SW1, a cathode electrode of the parasitic diode BD1 is substantially the same as the drain electrode of the MOSFET, and an anode electrode of the parasitic diode BD1 is substantially the same as the source electrode of the MOSFET.

FIGS. 5A and 5B illustrate a top view (FIG. 5A) and a cross-sectional view (FIG. 5B) of the first semiconductor chip C1. The switching device SW1 is a MOSFET, and the first semiconductor chip C1 has a drain electrode DE on its back face and has a gate electrode GE and a source electrode SE on its front face.

A diode device D2 is formed in the second semiconductor chip C2. FIGS. 6A and 6B illustrate a top view (FIG. 6A) and a cross-sectional view (FIG. 6B) of the second semiconductor chip C2. The diode device D2 is a Schottky barrier diode, and the second semiconductor chip C2 has a cathode electrode CE on its back face and an anode electrode AE on its front face.

The first and second semiconductor chips C1 and C2 are SiC substrate chips. Note that they are not limited to SiC, other wide bandgap semiconductors such as Gallium Nitride (GaN) may be used, for example. The free-wheeling diode is preferably a Schottky barrier diode containing Schottky junctions of metal and SiC, but may also be a Schottky barrier diode containing Schottky junctions of metal and S1.

<Chip Arrangement>

Next, the arrangement of the first and second semiconductor chips C1 and C2 will be described with reference to FIG. 2. In an embodiment of the present disclosure, the first and second semiconductor chips C1 and C2 have the same outline shape in top view, which is a rectangle having parallel sides in the x-axis and y-axis directions. It is assumed here that the first and second semiconductor chips C1 and C2 have the same shape, but may have different shapes.

The first semiconductor chip C1 is arranged in the first conductive pattern 31. In the first semiconductor chip C1, the drain electrode DE (FIG. 5B) of the switching device SW1 provided at its back face is mechanically and electrically coupled to the first conductive pattern 31.

The first semiconductor chip C11 is arranged closer to the side 32*a*, of the sides 32*a* and 32*b* of the second conductive pattern 32, in the first conductive pattern 31. Meanwhile, the first semiconductor chip C12 is arranged closer to the side 32*b*, of the sides 32*a* and 32*b*, in the first conductive pattern 31.

The second semiconductor chip C2 is arranged in the first conductive pattern 31. In the second semiconductor chip C2, the cathode electrode CE of the diode device D2 provided in its back face is mechanically and electrically coupled to the first conductive pattern 31.

The second semiconductor chip C21 is arranged closer to the side 32*a*, of the sides 32*a* and 32*b* of the second conductive pattern 32, in the first conductive pattern 31. Meanwhile, the second semiconductor chip C22 is arranged closer to the side 32*b*, of the sides 32*a* and 32*b*, in the first conductive pattern 31.

The second semiconductor chip C21 is arranged at a position shifted in parallel, by a predetermined distance, in the x-axis direction with respect to the first semiconductor chip C11, such that the length of the wire W21 to be described later is equal to that of the wire W1*l*. In an embodiment of the present disclosure, the side on the +y side of the first semiconductor chip C11 and the side on the +y side of the second semiconductor chip C21 are arranged on a predetermined axis in the x-axis direction. However, the arrangement is not limited thereto, as long as the two chips are arranged such that the length of the wire W21 and the length of the wire W1*l* are equal.

The second semiconductor chip C22 is arranged at a predetermined position closer to the side 32*b* in the first conductive pattern 31 sandwiching the second conductive pattern 32, such that the length of the wire W22 to be described later is equal to that of the wire W11. In an embodiment of the present disclosure, the position of the second semiconductor chip C22 is not limited to the position illustrated in FIG. 2 as long as the length of the wire W22 is equal to the length of the wire W11.

The first semiconductor chip C12 is arranged at a predetermined position closer to the side 32*b* in the first conductive pattern 31 sandwiching the second conductive pattern 32, such that the length of the wire W12 to be described later is equal to the length of the wire W11. In an embodiment of the present disclosure, the position of the second semiconductor chip C12 is not limited to the position illustrated in FIG. 2, as long as the length of the wire W12 is equal to the length of the wire W11.

<Details of Wire>

The wire is made of copper, aluminum, gold or an alloy containing them. The wire has a diameter of 50 μm or more and 500 μm or less. The diameter of the wire and the number thereof may be determined by the semiconductor chip size and the magnitude of current.

The first wire W1*l* couples the source electrode of the first semiconductor chip C11 to the second conductive pattern 32. The first wire W11 corresponds to the wiring having the inductance L11 in the electronic circuit 10 of FIG. 1. The first wire W12 couples the source electrode of the first semiconductor chip C12 to the second conductive pattern 32. The first wire W12 corresponds to the wiring having the inductance L12 in the electronic circuit 10 of FIG. 1.

The second wire W21 couples the anode electrode of the second semiconductor chip C21 to the second conductive pattern 32. The second wire W21 corresponds to the wiring having the inductance L21 in the electronic circuit 10 of FIG. 1. The second wire W22 couples the anode electrode of the second semiconductor chip C22 to the second conductive pattern 32. The second wire W22 corresponds to the wiring having the inductance L22 in the electronic circuit 10 of FIG. 1.

The second wire W2 has substantially the same length as the first wire W1. Here, "substantially the same length" means that a difference in length is within the range of manufacturing variation.

FIG. 4 is an enlarged view of a section A in FIG. 2. As illustrated in FIG. 4, each of the number of the first wires W1 and the number of the second wires W2 is not limited to one, but may be more than one. The same applies to the third and fourth wires W3 and W4 which will be described later in detail.

The first and second wires W1 and W2 are parallel to the y-axis direction. The relationship among the first wire W1*l*, the second wire W21, and the second wire W22 will be described.

The second wire W21 couples the anode electrode of the second semiconductor chip C21 to the second conductive pattern 32 so as to be parallel to the first wire W11. The second wire W22 couples the anode electrode of the second semiconductor chip C22 to the second conductive pattern 32 so as to be parallel to the first wire W11.

<Inductance>

Next, a correspondence relationship between the inductances Lp, Ls1, L11, L21, L12, and L22 in the electronic circuit 10 illustrated in FIG. 1 and the semiconductor device 20 illustrated in FIG. 2 will be described.

The inductance Lp corresponds to an inductance obtained by combining the inductances in the paths from the drain electrode of the switching device SW11, the drain electrode of the switching device SW12, the cathode electrode of the diode device D21, and the cathode electrode of the diode device D22 to the positive terminal P in the first conductive pattern 31 with the inductance of the positive terminal P itself (from one end to the other end of the terminal).

The inductance L11 corresponds to the inductance of the first wire W11. The inductance L21 corresponds to the inductance of the second wire W21. The inductance L12 corresponds to the inductance of the first wire W12. The inductance L22 corresponds to the inductance of the second wire W22.

The inductance Ls1 corresponds to an inductance obtained by combining the inductance of the output terminal M itself (from one end to the other end of the terminal) with the inductances of the first wire W11, the second wire W21, the first wire W12, and the second wire W22 in the second conductive pattern 32.

<Variations in Wires>

Here, manufacturing variations in wire length in the manufacturing process of the semiconductor device 20 will be described. In the manufacturing process of the semiconductor device 20, variations in the actual wire length generally vary depending on the directions of the wires and the layout of the wires.

For example, regarding the actual length of wires arranged in parallel with the y-axis, a variation that occurs when a plurality of wires are formed at positions shifted in parallel in the x-axis direction (hereinafter referred to as "manufacturing variation in the x-axis direction") generally differs from a variation that occurs when a plurality of wires are formed at positions shifted in parallel in the y-axis direction (hereinafter referred to as "manufacturing variation in the y-axis direction"). The following described this more specifically with reference to FIG. 4.

First, it is assumed that the actual length of the wire W11 is d11. In the example of FIG. 4, the number of wires coupling the semiconductor chips C and the second conductive pattern 32 is three. Since these three wires are close enough to each other, variations in length among these three wires will be ignored for convenience in the following description.

In this event, the length d21 of the wire W21 differs from d11 by Δd1 (d21=d11+Δd1) due to manufacturing variations in the x-axis direction, for example. Meanwhile, the length d22 of the wire W22 differs from d11 by Δd2 (d22=d11+Δd2) due to manufacturing variations in the y-axis direction, for example. In this event, Δd1 can be set smaller than Δd2. For example, Δd1 can be set to 5% of d11 or less. Likewise, Δd2 can be set to 10% of d11 or less.

Thus, the difference between the inductance L21 of the second wire W21 and the inductance L11 of the first wire W11 can be set smaller than the difference between the inductance L22 of the second wire W22 and the inductance L11 of the first wire W**1*l*. For example, the inductance L21 can be set to 95% or more and 105% or less of the inductance L11. The inductance L22 can be set to 90% or more and 110% or less of the inductance L11**.

Accordingly, the arrangement of the first and second semiconductor chips C11 and C21 in the semiconductor device 20 according to an embodiment of the present disclosure makes it possible to minimize the difference between the inductances L11 and L21.

If the difference between the inductances L11 and L21 increases, the issue described in the description of the electronic circuit 10 arises.

In other words, when the inductance L11 is larger than the inductance L21, the substantial gate-source voltage of the switching device SW**1*l* provided in the semiconductor chip C11 drops, resulting in a decrease in switching speed of the switching device SW11**.

Meanwhile, when the inductance L21 is larger than the inductance L11, the free-wheeling current flowing through the body diode BD11 increases.

The same applies to the arrangement of the first and second semiconductor chips C12 and C22. That is, the difference between the inductances L12 and L22 can be minimized.

In an embodiment of the present disclosure, the inductances L11 and L12 can be set substantially equal within the range of inductance variation due to the wire length difference Δd1 caused by the manufacturing variation in the x direction. For example, the inductance L12 can be set to 95% or more and 105% or less of the inductance L11. Likewise, the inductances L12 and L22 can be set substantially equal within the range of inductance variation due to the wire length difference Δd1 caused by the manufacturing variation in the x direction. For example, the inductance L12 can be set to 95% or more and 105% or less of the inductance L11. Furthermore, in an embodiment of the present disclosure, the inductances L11, L12, L21, and L22 can be set substantially equal within the range of inductance variation due to the sum of the wire length differences Δd1 and Δd2 caused by manufacturing variations in the x and y directions. For example, the inductance variation can be in the range of 15% or less.

Accordingly, the arrangement of the first and second semiconductor chips C1 and C2 in the semiconductor device 20 according to an embodiment of the present disclosure makes it possible to suppress both an increase in free-wheeling current flowing through the body diodes BD11 and BD12 and a decrease in switching speed of the switching devices SW11 and SW12.

In order to minimize the difference between the inductances L11 and L21, the wires W**1*l* and W21 are designed to be equal not only in length but also in thickness, curvature, material, number, and the like. The same applies to the wires W12 and W22**.

<<Lower Arm>>

Next, a lower arm configuration will be described with reference to FIG. 3. Since the configuration of the third and fourth semiconductor chips C3 and C4 and the third and fourth wires W3 and W4 in the lower arm is the same as that of the first and second semiconductor chips C1 and C2 and the first and second wires W1 and W2 described above, description of overlapping parts is omitted.

<Conductive Pattern>

The third conductive pattern 33 corresponds to wiring for electrically connecting the drain electrode of the lower arm switching device SW3 and the cathode electrode of the lower arm diode device D4 to the output terminal M in the electronic circuit 10 of FIG. 1.

The fourth conductive pattern 34 corresponds to wiring for electrically connecting the source electrode of the switching device SW3 and the anode electrode of the diode device D4 to the negative terminal N in the electronic circuit 10. The fourth conductive pattern 34 corresponds to the wiring having the inductance Ls2 in the electronic circuit 10. The fourth conductive pattern 34 has a rectangular shape.

The sixth conductive pattern 36 corresponds to wiring for coupling the gate electrode of the lower arm switching device SW3 to the second control terminal IN2 in the electronic circuit 10.

A layout relationship between the third and fourth conductive patterns 33 and 34 will be described. First, in an embodiment of the present disclosure, the fourth conductive pattern 34 has a rectangular shape. The fourth conductive pattern 34 has two sides **34*a* and 34*b* along the x-axis direction. The third conductive pattern 33 is formed so as to sandwich at least one side 34*a* of the fourth conductive pattern 34 along the x-axis direction and the other side 34*b*. The third conductive pattern 33 surrounds the fourth conductive pattern 34** in top view.

<Chip Arrangement>

The third semiconductor chip C3 is arranged in the third conductive pattern 33. The drain electrode DE of the switching device SW3 provided in the back face of the third semiconductor chip C3 is electrically coupled to the third conductive pattern 33.

The third semiconductor chip C31 is arranged closer to the side **34*a*, of the sides 34*a* and 34*b* of the fourth conductive pattern 34, in the third conductive pattern 33. The third semiconductor chip C32 is arranged closer to the side 34*b*, of the sides 34*a* and 34*b* of the fourth conductive pattern 34, in the third conductive pattern 33**.

The fourth semiconductor chip C4 is arranged in the third conductive pattern 33. The cathode electrode CE of the diode device D4 provided in the back face of the fourth semiconductor chip C4 is electrically coupled to the third conductive pattern 33.

The fourth semiconductor chip C41 is arranged closer to the side **34*a*, of the sides 34*a* and 34*b* of the fourth conductive pattern 34, in the third conductive pattern 33**.

The fourth semiconductor chip C42 is arranged closer to the side 34*b*, of the sides 34*a* and 34*b* of the fourth conductive pattern 34, in the third conductive pattern 33.

The relative arrangement of the third semiconductor chips C31 and C32 and the fourth semiconductor chips C41 and C42 is the same as the relative arrangement of the first semiconductor chips C11 and C12 and the second semiconductor chips C21 and C22 in the upper arm.

<Wires>

The third wire W31 couples the source electrode of the third semiconductor chip C31 to the fourth conductive pattern 34. The third wire W31 corresponds to the wiring having the inductance L31 in the electronic circuit 10 of FIG. 1. The third wire W32 couples the source electrode of the third semiconductor chip C32 to the fourth conductive pattern 34. The third wire W32 corresponds to the wiring having the inductance L32 in the electronic circuit 10 of FIG. 1.

The fourth wire W41 couples the anode electrode of the fourth semiconductor chip C41 to the fourth conductive pattern 34. The fourth wire W41 corresponds to the wiring having the inductance L41 in the electronic circuit 10 of FIG. 1. The fourth wire W42 couples the anode electrode of the fourth semiconductor chip C42 to the fourth conductive pattern 34. The fourth wire W42 corresponds to the wiring having the inductance L42 in the electronic circuit 10 of FIG. 1.

The fourth wire W4 has substantially the same length as the third wire W3.

<Inductance>

The correspondence relationships between the inductances Ls2, L31, L41, L32, and L42 in the electronic circuit 10 illustrated in FIG. 1 and the semiconductor device 20 illustrated in FIG. 2 will be described.

The inductance Ls2 corresponds to an inductance obtained by combining the inductance of the negative terminal N itself (from one end to the other end of the terminal) with the inductances of the third wire W31, the fourth wire W41, the third wire W32, and the fourth wire W42 in the fourth conductive pattern 34.

The inductance L31 corresponds to the inductance of the third wire W31. The inductance L41 corresponds to the inductance of the fourth wire W41. The inductance L32 corresponds to the inductance of the third wire W32. The inductance L42 corresponds to the inductance of the fourth wire W42.

As described above, the relative arrangement of the third semiconductor chips C31 and C32 and the fourth semiconductor chips C41 and C42 is the same as that of the first semiconductor chips C11 and C12 and the second semiconductor chips C21 and C22 in the upper arm.

Accordingly, for the same reason as in the upper arm, an actual difference in length between the wires W31 and W41 can be minimized. This makes it possible to minimize a difference between the inductances L31 and L41. Likewise, a difference in length between the wires W32 and W42 can be minimized. This makes it possible to minimize a difference between the inductances L32 and L42.

<Simulation Result>

A circuit simulation is performed to study the influence of variations in inductance of wiring in a half-bridge circuit.

Figure 7:
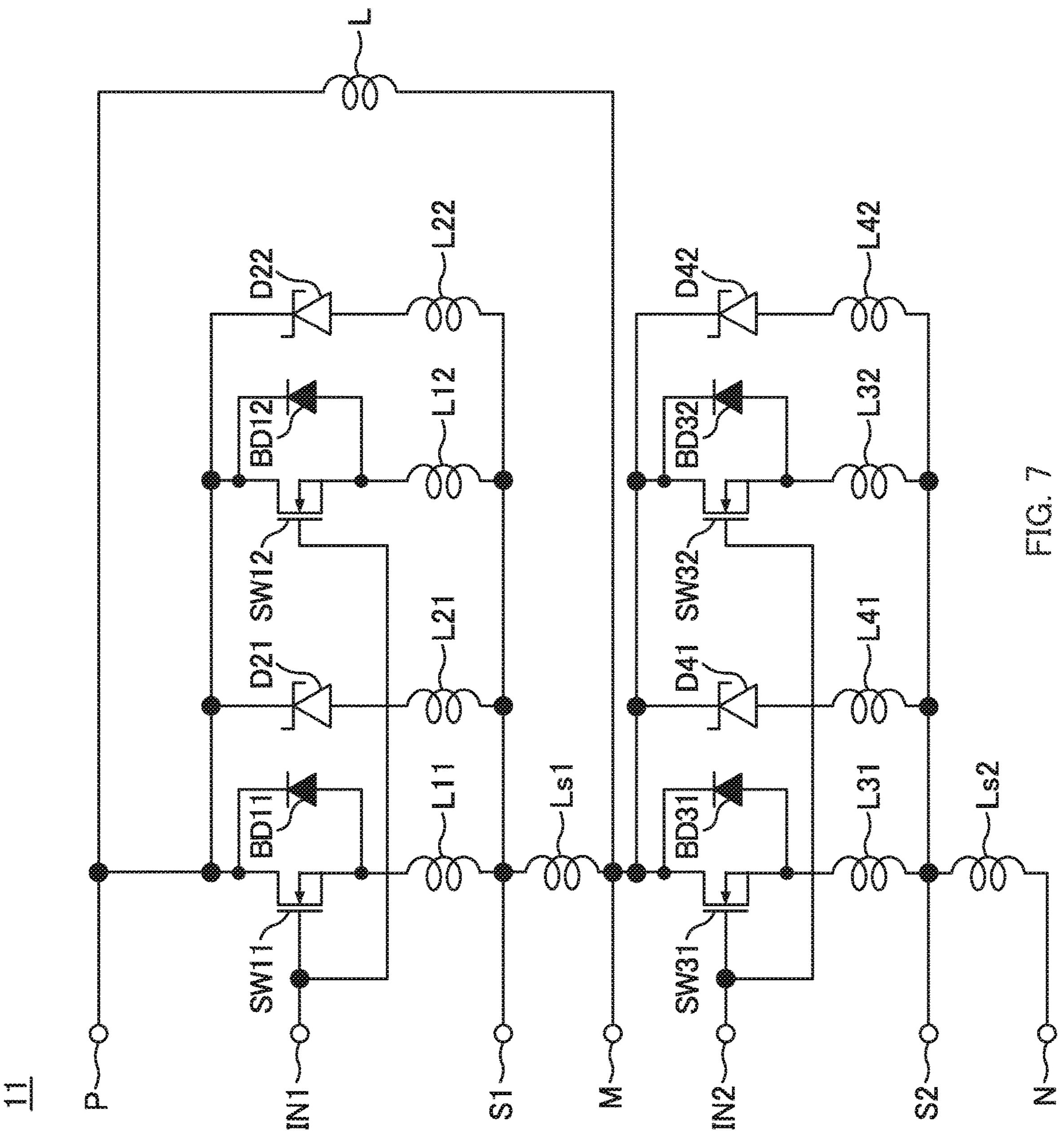
FIG. 7 is a diagram illustrating an electronic circuit according to an embodiment.

FIG. 7 is a circuit diagram of an electronic circuit 11 used for the circuit simulation. The electronic circuit 11 has an inductance load L coupled between the positive terminal P and the output terminal M in the electronic circuit 10 illustrated in FIG. 1. The inductance Lp of the wiring coupled to the positive terminal P in the electronic circuit 10 illustrated in FIG. 1 is ignored.

<Circuit Simulation 1>

First, a simulation is performed for changes with time in free-wheeling current by assigning inductance values illustrated in FIG. 8 to the inductances L11, L12, L21, L22, L31, L32, L41, and L42. Calculation conditions will be described below.

[Common Conditions]

The upper arm inductances L11, L12, L21, and L22 are set equal to the lower arm inductances L31, L32, L41, and L42, respectively. The inductance Ls1 of the wiring coupled to the output terminal M and the inductance Ls1 coupled to the negative terminal N are set to 1 [nH].

An operating voltage of the diode device D2 is set lower than that of the body diode BD1 of the switching device SW1.

[Individual Conditions]

Example 1 is a case where the inductances L11, L12, L21, and L22 are all equal.

Example 2 is a case where the inductances L11 and L21 are equal and the inductances L12 and L22 are equal.

Comparative Example 1 is a case where the inductances L11 and L12 are equal and the inductances L21 and L22 are equal.

Figure 9:
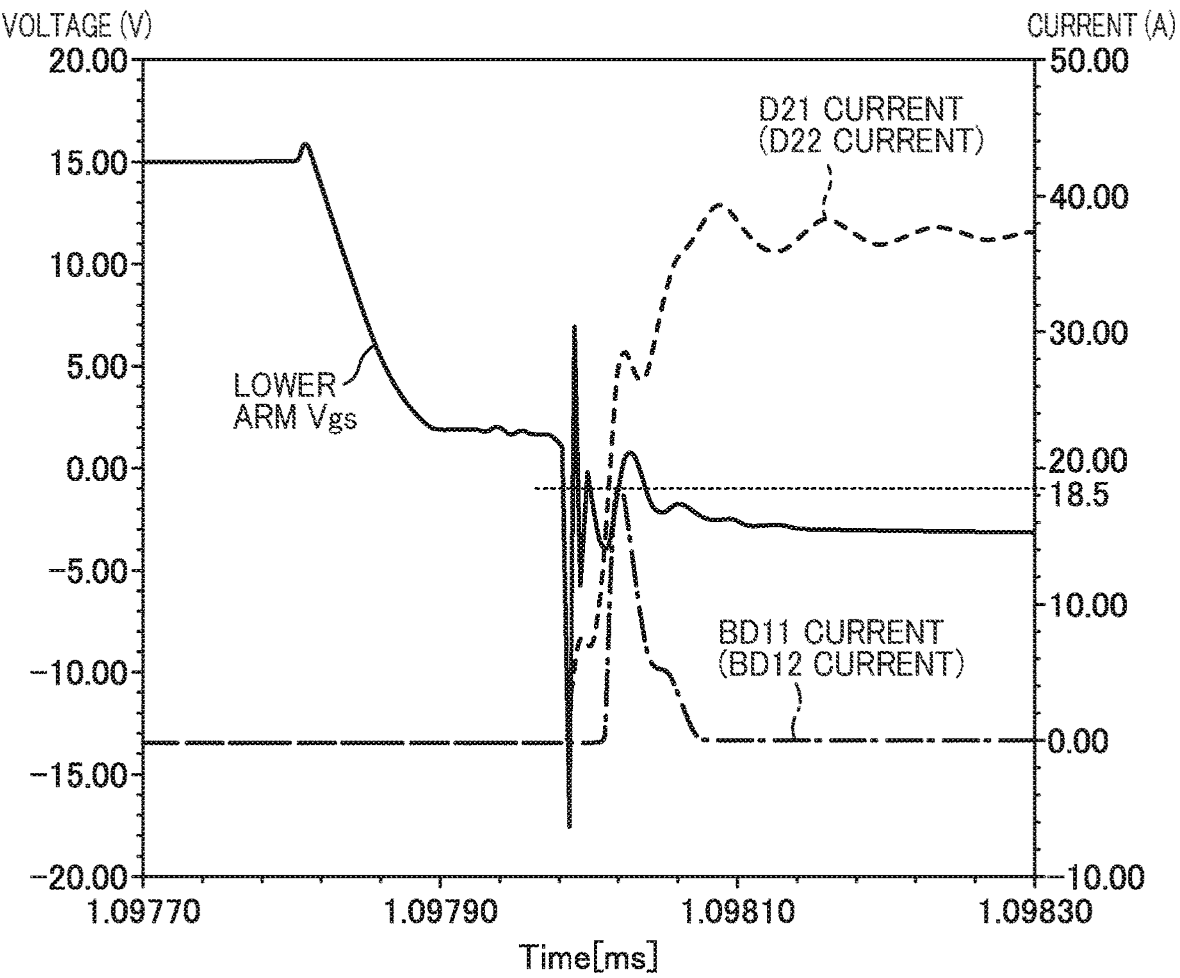
FIG. 9 is a graph illustrating simulation results of Example 1.
Figure 10:
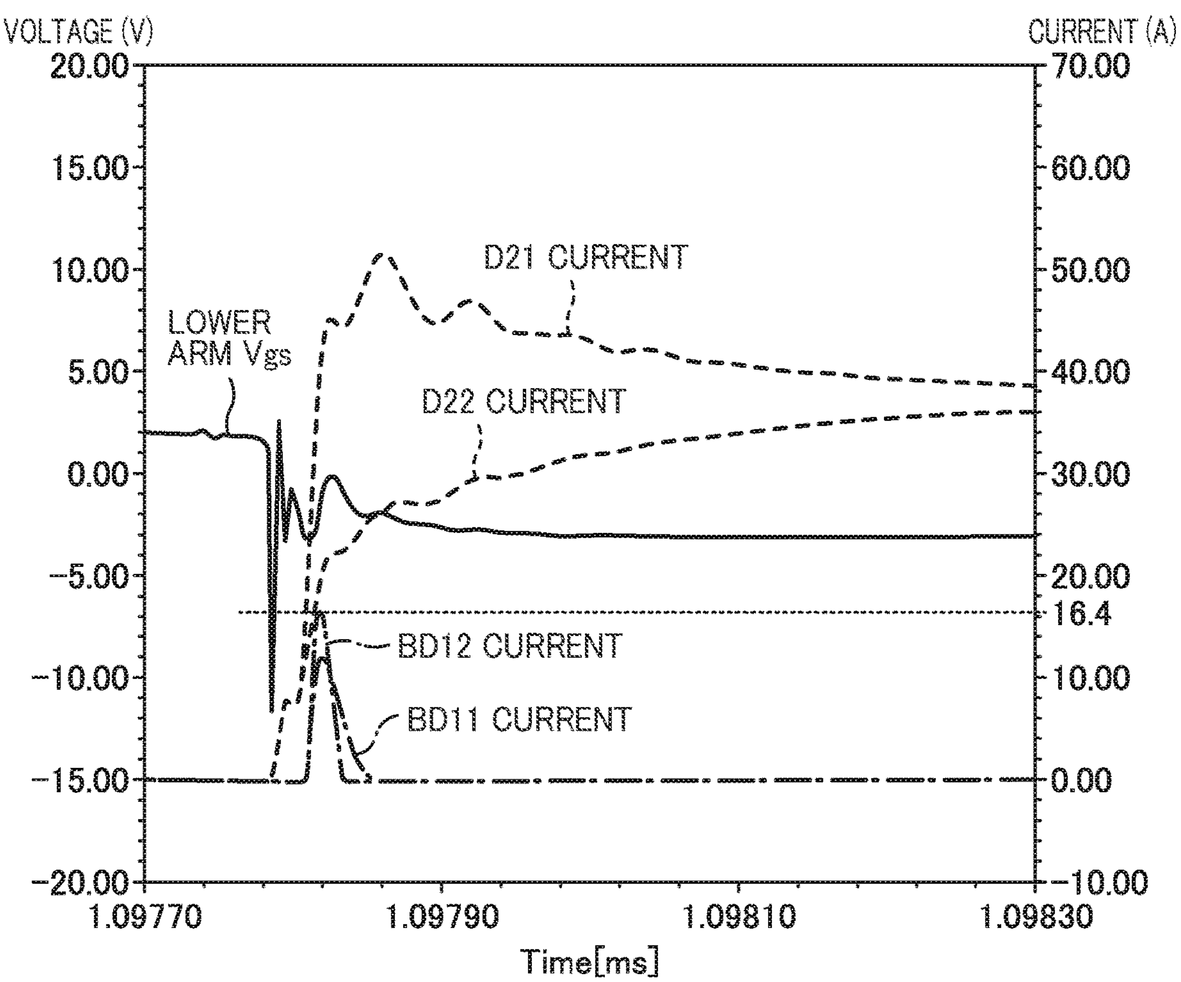
FIG. 10 is a graph illustrating simulation results of Example 2.
Figure 11:
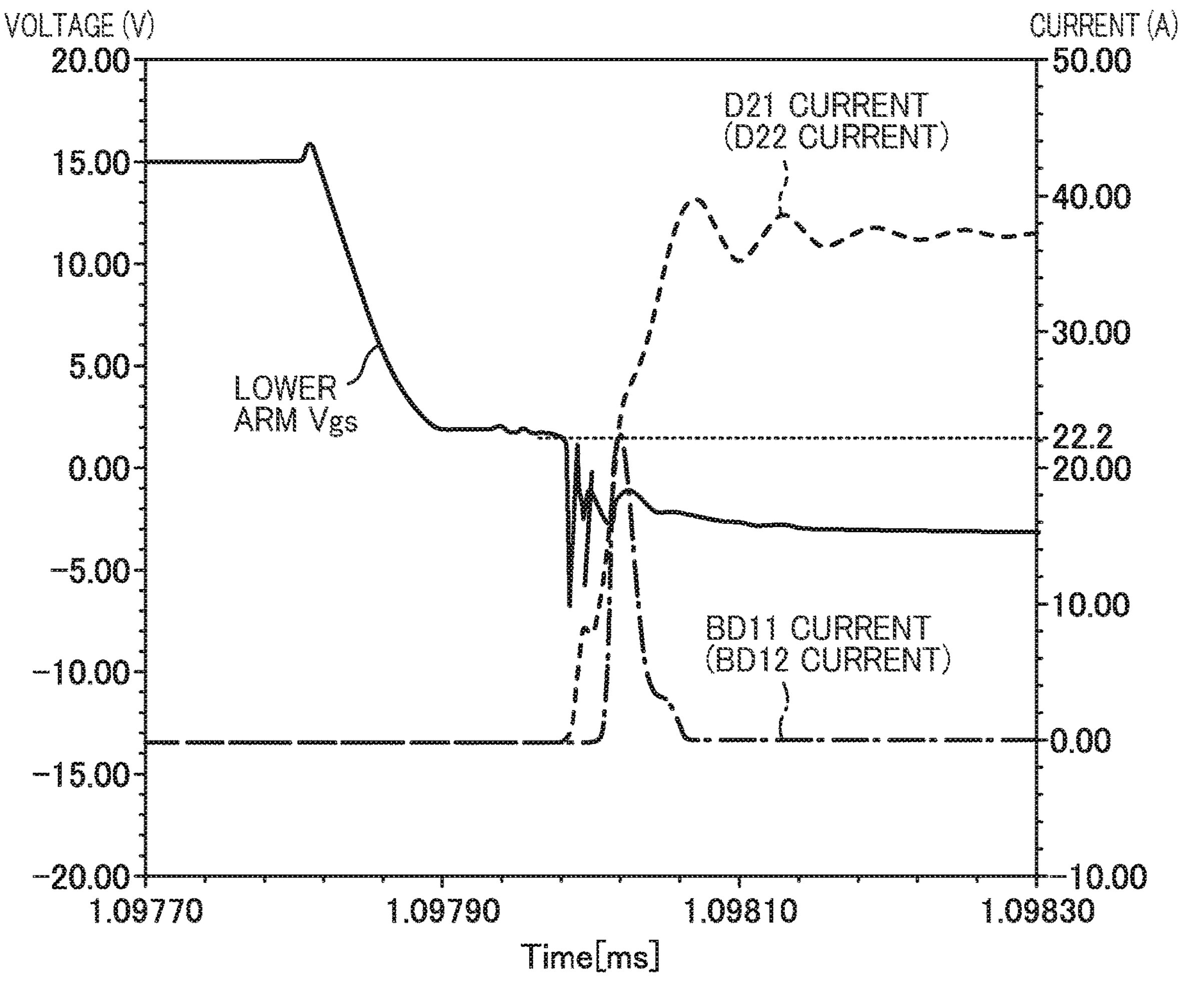
FIG. 11 is a graph illustrating simulation results of Comparative Example 1.

FIGS. 9, 10, and 11 are graphs illustrating the simulation results of Example 1, Example 2, and Comparative Example 1, respectively. FIGS. 9 to 11 illustrate time transitions of free-wheeling currents flowing through the body diodes BD11 and BD12 of the respective switching devices SW1*l* and SW12 and the diode devices D21 and D22, respectively.

In FIGS. 9 to 11, the solid line indicates the gate-source voltage of the lower arm switching device SW2 (left axis). The dashed line indicates the free-wheeling current flowing through the body diodes BD11 and BD12 of the respective switching devices SW11 and SW12 (right axis). The dotted line indicates the free-wheeling current flowing through the diode devices D21 and D22 (right axis).

In Example 1, Example 2, and Comparative Example 1, larger peak values among peak values of the free-wheeling currents flowing through the body diodes BD11 and BD12 of the respective switching device SW1*l* and SW12 are compared. In FIGS. 9 to 11, the positions of the larger peaks are indicated by broken lines.

In Example 1, the free-wheeling currents flowing through the body diodes BD11 and BD12 of the respective switching devices SW1*l* and SW12 are equal, and have a peak value of 18.5 A. In Example 2, the free-wheeling current flowing through the body diode BD12 of the switching device SW12 gives a larger peak value of 16.4 A. In Comparative Example 1, the free-wheeling currents flowing through the body diodes BD11 and BD12 of the respective switching devices SW1*l* and SW12 are equal, and have a peak value of 22.2 A.

From these results, as in Comparative Example 1, when the inductance L11 and the inductance L21 are different, that is, there is a difference therebetween, the ratio of the free-wheeling current distributed to the switching device SW1 increases, which is not preferable. Such a difference between the inductances L11 and L21 is likely to occur in a semiconductor device 21 illustrated in FIG. 12, for example.

Figure 12:
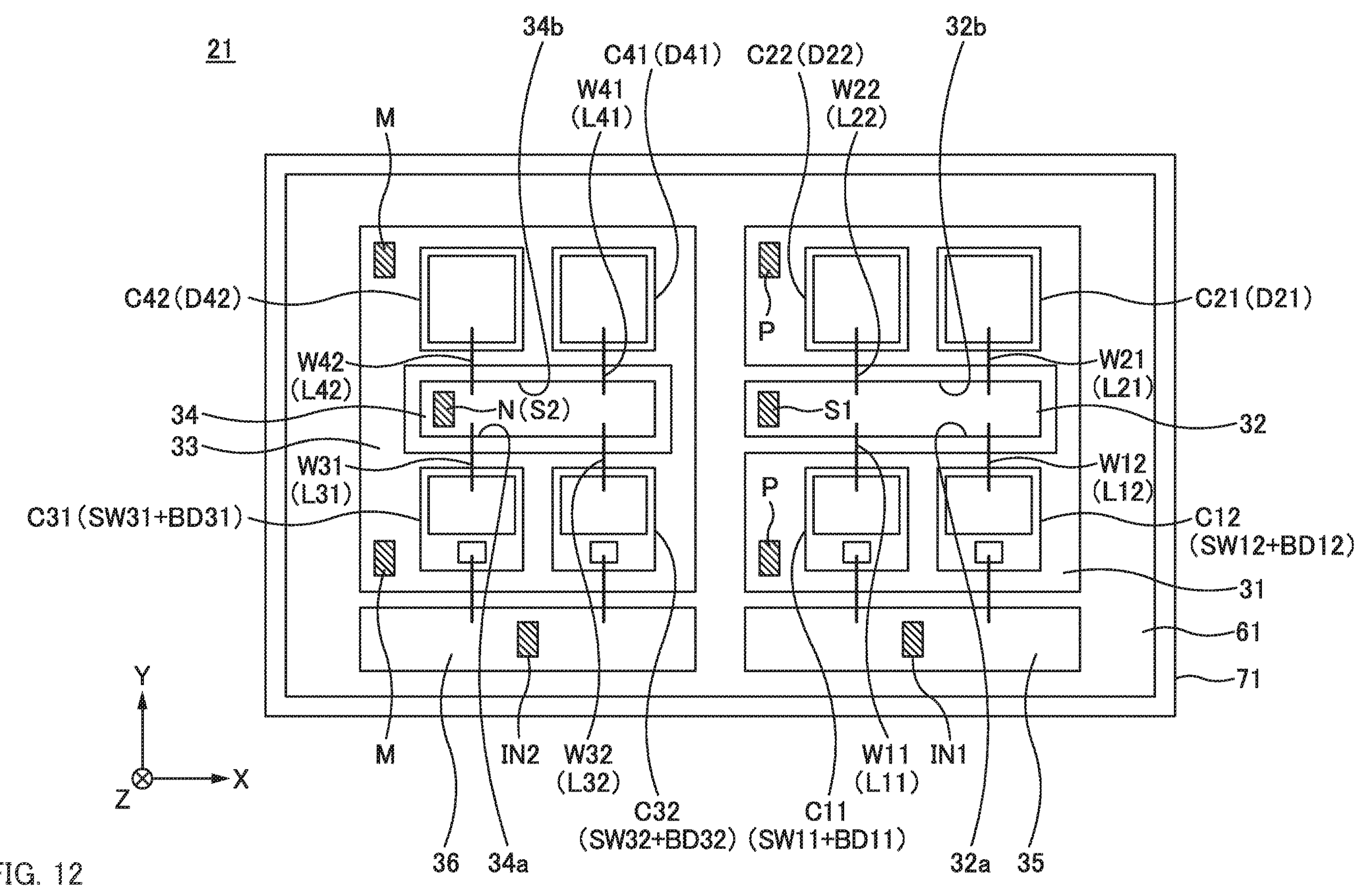
FIG. 12 is a diagram for explaining a configuration of a semiconductor device according to a comparative example.

The semiconductor device 21 illustrated in FIG. 12 is different from the semiconductor device 20 of the first embodiment in arrangement of first semiconductor chips C11 and C12 and second semiconductor chips C21 and C22 in the upper arm.

The second semiconductor chip C21 is arranged at a position shifted in parallel, by a predetermined distance, in the y-axis direction with respect to the first semiconductor chip C11, such that the length of the wire W21 is equal to that of the wire W1*l*. The second semiconductor chip C12 is arranged at a position shifted in parallel, by a predetermined distance, in the x-axis direction with respect to the first semiconductor chip C11, such that the length of the wire W12 is equal to that of the wire W11.

The second semiconductor chip C22 is arranged at a position shifted in parallel, by a predetermined distance, in the y-axis direction with respect to the first semiconductor chip C12 and at the position shifted inparallel, by a predetermined distance, in the x-axis direction with respect to the second semiconductor chip C21, such that the length of the wire W22 is equal to that of the wire W11.

In the case of the semiconductor device 21, differences are likely to occur between the inductances L11 and L21 and between the inductances L12 and L22.

However, when there is no difference between the inductances L11 and L21 as in Example 2, the ratio of the free-wheeling current distributed to the switching device SW1 can be kept small. The difference between the inductances L11 and L21 can be minimized according to the semiconductor device 20 (FIG. 2) of the first embodiment.

<Circuit Simulation 2>

First, inductance values illustrated in FIG. 13 are assigned to the inductances L11, L12, L21, L22, L31, L32, L41, and L42, and peak values of the free-wheeling current are calculated under respective conditions. Calculation conditions will be described below.

In Example 3, assuming that a difference between the inductances L11 and L12 is ΔL, the change of the peak value of the free-wheeling current with ΔL is observed. Assuming that a median value for both the inductances L11 and L12 is Lmid, calculations are performed for two cases where Lmid is 3 [nH] and 4 [nH].

In Comparative Example 2, assuming that a difference between the inductances L21 and L11 is ΔL, the change of the peak value of the free-wheeling current with ΔL is observed. Assuming that a median value for both the inductances L11 and L21 is Lmid, calculations are performed for two cases where Lmid is 3 [nH] and 4 [nH].

[Calculation Result]

Figure 14:
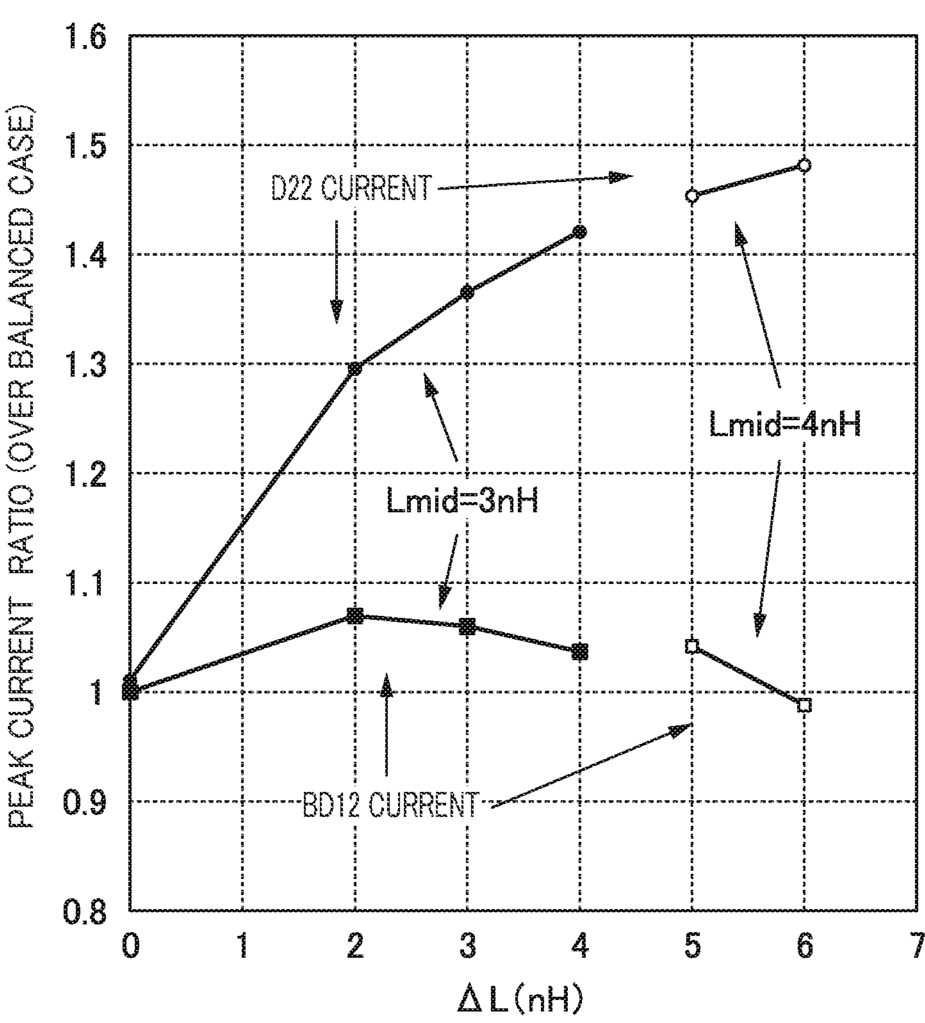
FIG. 14 is a graph illustrating calculation results of Example 3.
Figure 15:
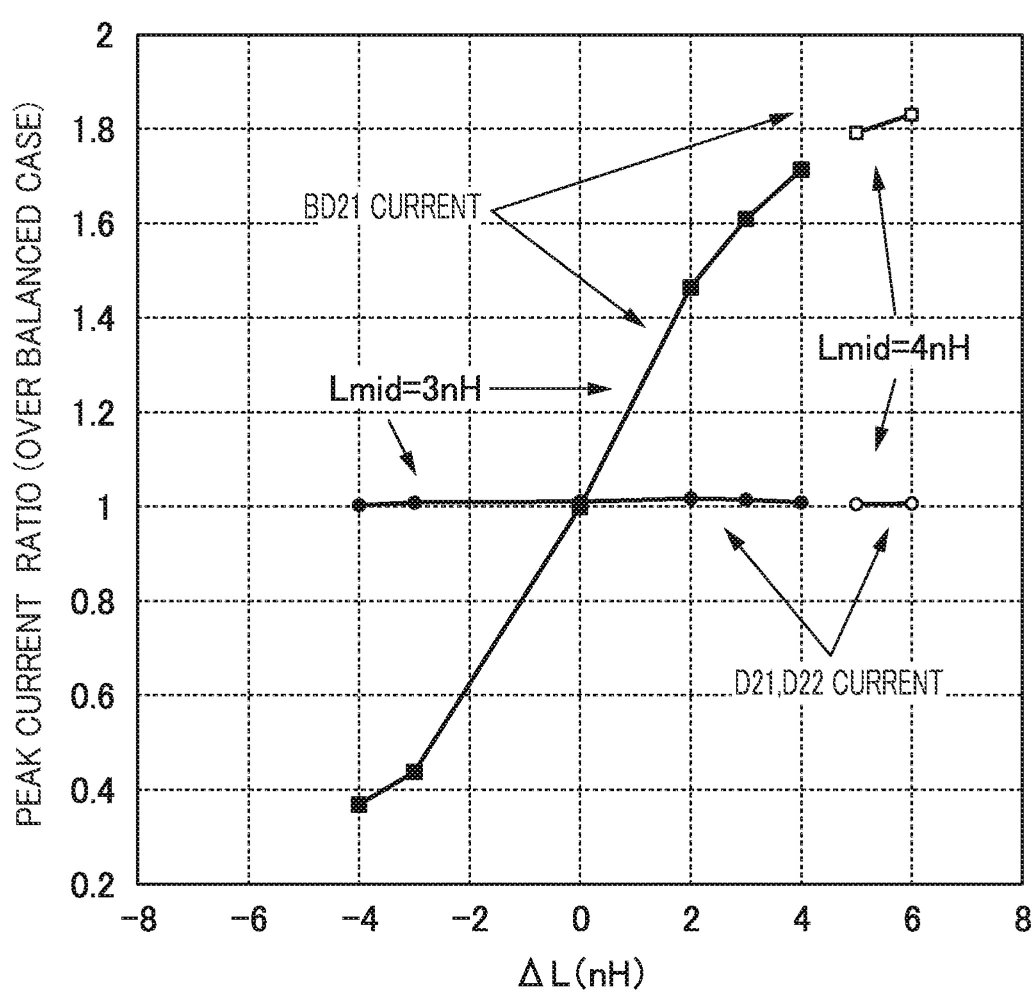
FIG. 15 is a graph illustrating calculation results of Comparative Example 2.

FIGS. 14 and 15 are graphs illustrating the calculation results of Example 3 and Comparative Example 2, respectively. In these graphs, the horizontal axis represents ΔL and the vertical axis represents the peak value of the free-wheeling current flowing through the body diode BD1 of switching device SW1 and the diode device D2 (assuming that the peak value of the free-wheeling current when ΔL=0 is set to 1).

In Comparative Example 2, as the absolute value of ΔL (difference between the inductances L21 and L11) increases, the peak value of the free-wheeling current flowing through the body diode of the switching device SW1 increases. In comparison, the change in the peak value of the free-wheeling current flowing through the diode device D2 is small.

In Example 3, as the absolute value of ΔL (difference between the inductances L11 and L12) increases, the peak value of the free-wheeling current flowing through the diode device D2 increases. In comparison, the change in the peak value of the free-wheeling current flowing through the body diode of the switching device SW1 is small.

From the above results, it can be understood that it is particularly preferable to suppress the difference between the inductances L11 and L21. Such a difference is likely to occur in the semiconductor device 21 illustrated in FIG. 12, but can be minimized in the semiconductor device 20 (FIG. 2) according to an embodiment of the present disclosure.

Therefore, according to the semiconductor device 20 of an embodiment of the present disclosure, a half-bridge circuit is realized that can suppress both an increase in free-wheeling current flowing through the switching devices SW1 and SW3 and a decrease in switching speed of the switching devices SW1 and SW3.

Second Embodiment

Figure 16:
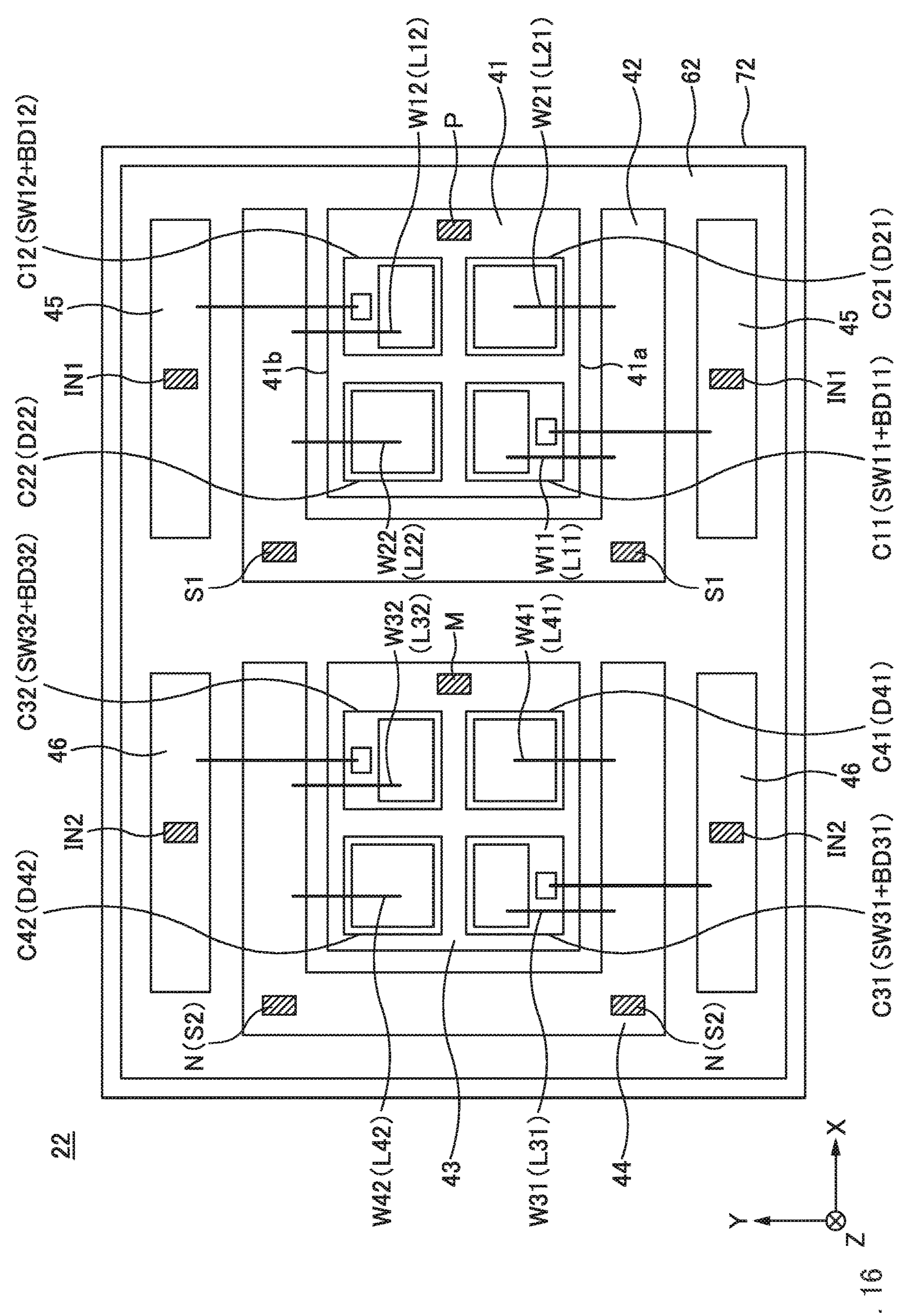
FIG. 16 is a diagram for explaining a configuration of a semiconductor device.

FIG. 16 is a schematic plan view illustrating a configuration of a semiconductor device 22 according to an embodiment of the present disclosure. The semiconductor device 22 is an example of a semiconductor device that embodies the electronic circuit 10 of FIG. 1, which is different from the first embodiment.

The semiconductor device 22 of an embodiment of the present disclosure is different from the semiconductor device 20 of the first embodiment, in the layout of the first to fourth conductive patterns 41 to 44 and the arrangement of the first to fourth semiconductor chips C1 to C4.

The first conductive pattern 41 has a rectangular shape. The first conductive pattern 41 has two sides **41*a* and 41*b*** along the x-axis direction.

The second conductive pattern 42 is formed so as to sandwich at least one side **41*a* of the first conductive pattern 41 along the x-axis direction and the other side 41*b*. The second conductive pattern 42 has a U shape in top view. In other words, the second conductive pattern 42 has a side facing the side 41*a* of the first conductive pattern 41 and a side facing the side 41*b***.

The first semiconductor chip C11 and the second semiconductor chip C21 are arranged closer to the side **41*a* in the first conductive pattern 41. The first semiconductor chip C12 and the second semiconductor chip C22 are arranged closer to the side 41*b* in the first conductive pattern 41**.

The first wire W1*l* couples the source electrode of the first semiconductor chip C11 to a part of the second conductive pattern 42 closer to the side **41*a* of the first conductive pattern 41**. The first wire W1*l* corresponds to the wiring having the inductance L1*l* in the electronic circuit 10 of FIG. 1. The first wire W12 couples the source electrode of the first semiconductor chip C12 and a part of the second conductive pattern 42 closer to the side **41*b***. The first wire W12 has an inductance L12 as a parasitic inductance.

The second wire W21 couples the anode electrode of the first semiconductor chip C21 to a part of the second conductive pattern 42 closer to the side **41*a* of the first conductive pattern 41. The second wire W21 corresponds to the wiring having the inductance L21 in the electronic circuit 10 of FIG. 1. The second wire W22 couples the anode electrode of the second semiconductor chip C22 to a part of the second conductive pattern 42 closer to the side 41*b* of the first conductive pattern 41**. The second wire W22 has an inductance L22.

The arrangement of the semiconductor chips in the semiconductor device 22 according to an embodiment of the present disclosure can also minimize the difference between the inductances L11 and L21. Likewise, the difference between the inductances L12 and L22 can be minimized.

This makes it possible to suppress both an increase in free-wheeling current flowing through the body diode BD1 of the switching device SW1 and a decrease in switching speed of the switching device SW1.

The coupling relationship among the third conductive pattern 43, the fourth conductive pattern 44, the third semiconductor chip C3, the fourth semiconductor chip C4, the third wire W3, and the fourth wire W4 is equivalent to that of the semiconductor device 20 according to the first embodiment. The configuration and arrangement of the third conductive pattern 43, the fourth conductive pattern 44, the third semiconductor chip C3, the fourth semiconductor chip C4, the third wire W3, and the fourth wire W4 are equivalent to those of the first conductive pattern 41, the second conductive pattern 42, the first semiconductor chip C1, the second semiconductor chip C2, the first wire W1, and the second wire W3 described above.

The semiconductor device 22 according to an embodiment of the present disclosure has been described above. According to such a configuration, a half-bridge circuit is realized that can suppress both an increase in free-wheeling current flowing through the switching devices SW1 and SW3 and a decrease in switching speed of the switching devices SW1 and SW3.

Third Embodiment

In an aspect of the first embodiment, the electronic circuit 10 has two switching devices SW1 and two diode devices D2 in its upper arm. Such a configuration is generalized such that each arm may have n (n is more than one) switching devices SW1 and the same number of diode devices D2.

In this case, a semiconductor device has n (n is more than one) first semiconductor chips C11 to C1*n* and the same number of second semiconductor chips C21 to C2*n* in its upper arm. The semiconductor device also has n third semiconductor chips C31 to C3*n* and the same number of fourth semiconductor chips C41 to C4*n* in its lower arm.

[Electronic Circuit]

Figure 17:
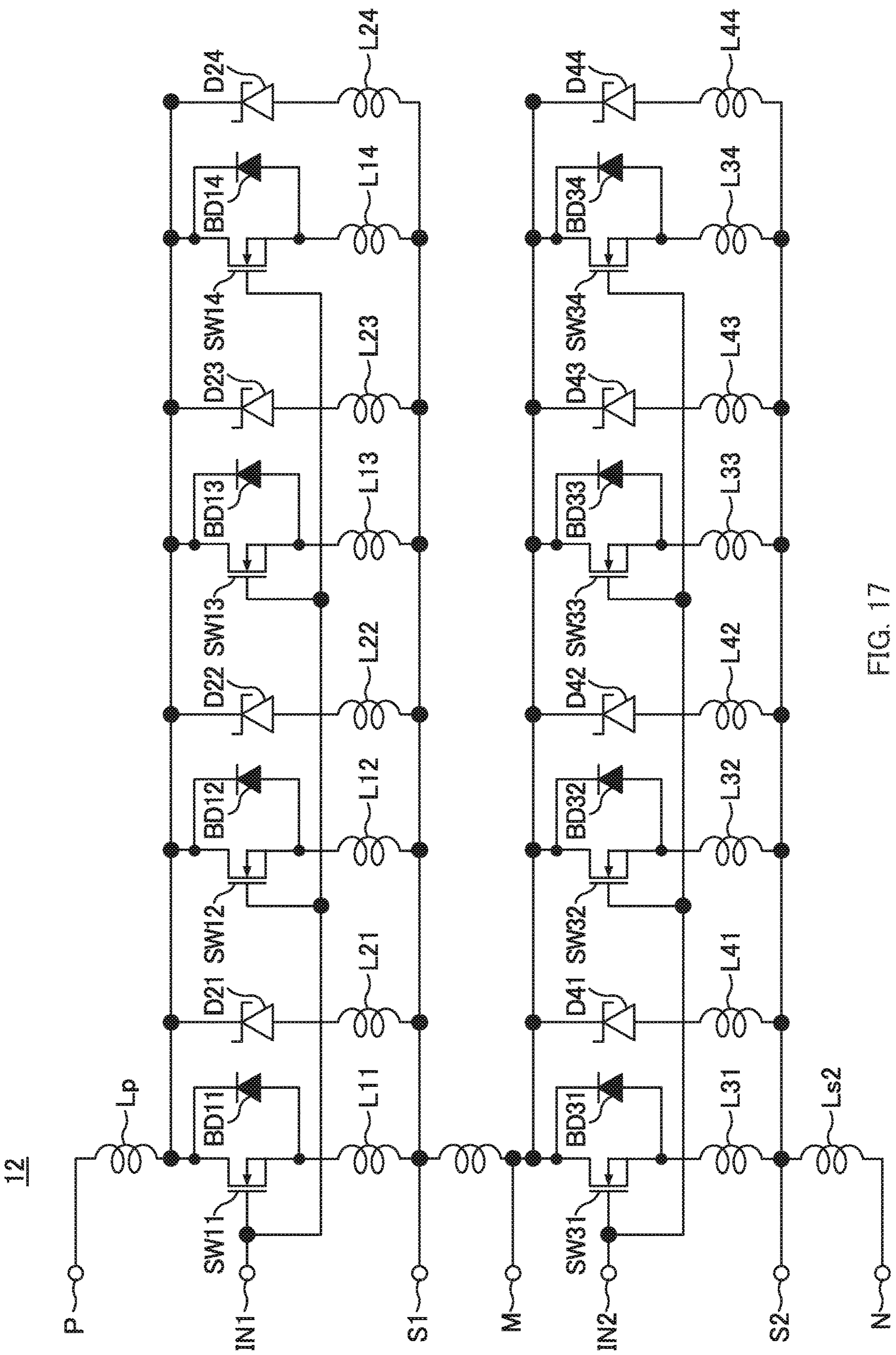
FIG. 17 is a diagram illustrating an electronic circuit.

FIG. 17 is a circuit diagram illustrating an electronic circuit 12 according to an embodiment of the present disclosure. "n" is four in an embodiment of the present disclosure. That is, the electronic circuit 12 according to an embodiment of the present disclosure has four switching devices SW1 and four diode devices D2 in its upper arm. The electronic circuit 12 also has four switching devices SW3 and four diode devices D4 in its lower arm.

The four upper arm switching devices SW1 and the four upper arm diode devices D2 are coupled in parallel with each other. The four lower arm switching devices SW3 and the four lower arm diode devices D4 are coupled in parallel with each other.

[Semiconductor Device]

Figure 18:
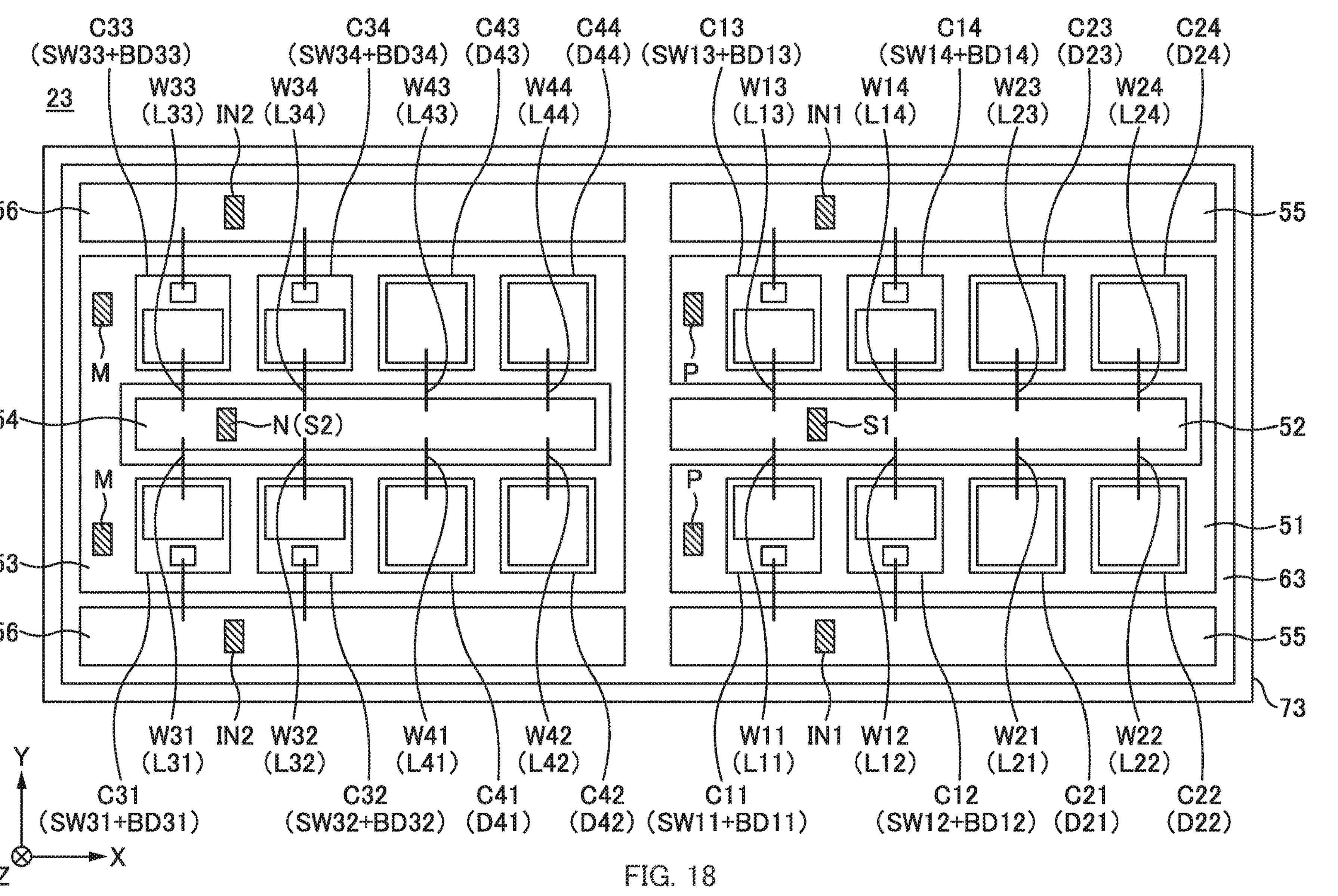
FIG. 18 is a diagram for explaining a configuration of a semiconductor device.

FIG. 18 is a schematic plan view illustrating a semiconductor device 23 according to an embodiment of the present disclosure. The semiconductor device 23 according to an embodiment of the present disclosure is an example of a semiconductor device that embodies the electronic circuit 12 of FIG. 17.

The semiconductor device 23 according to an embodiment of the present disclosure includes four first semiconductor chips C1, four second semiconductor chips C2, a plurality of first wires W1, and a plurality of second wires W2 in the upper arm.

The four first semiconductor chips C1 and the four second semiconductor chips C2 are arranged in two rows along the x-axis direction in a first conductive pattern 51.

The number of the first semiconductor chips C1 and the number of the second semiconductor chips C2 included in each of the two rows are the same. In an embodiment of the present disclosure, one row includes two first semiconductor chips C11 and C12 and two second semiconductor chips C21 and C22. The other row includes two first semiconductor chips C13 and C14 and two second semiconductor chips C23 and C24.

Here, in one row, the first semiconductor chip C11, the first semiconductor chip C12, the second semiconductor chip C21, and the second semiconductor chip C22 are arranged in this order. In the other row, the first semiconductor chip C13, the first semiconductor chip C14, the second semiconductor chip C23, and the second semiconductor chip C24 are arranged in this order.

The first wire W1 couples the source electrode of the first semiconductor chip C1 to the second conductive pattern 52. The first wires W11 to W14 correspond to the wirings having the inductances L11 to L14 in the electronic circuit 12 of FIG. 17, respectively.

The second wire W2 couples the anode electrode of the second semiconductor chip C2 to the second conductive pattern 52. The second wires W21 to W24 correspond to the wirings having the inductances L21 to L24 in the electronic circuit 12 of FIG. 17, respectively.

The arrangement of the semiconductor chips in the semiconductor device 23 according to an embodiment of the present disclosure can also minimize a differences between an inductance L1*k* and an inductance L2*k* (k=1 to 4).

This makes it possible to suppress both an increase in free-wheeling current flowing through the body diode BD1 of the switching device SW1 and a decrease in switching speed of the switching device SW1.

Fourth Embodiment

Figure 19:
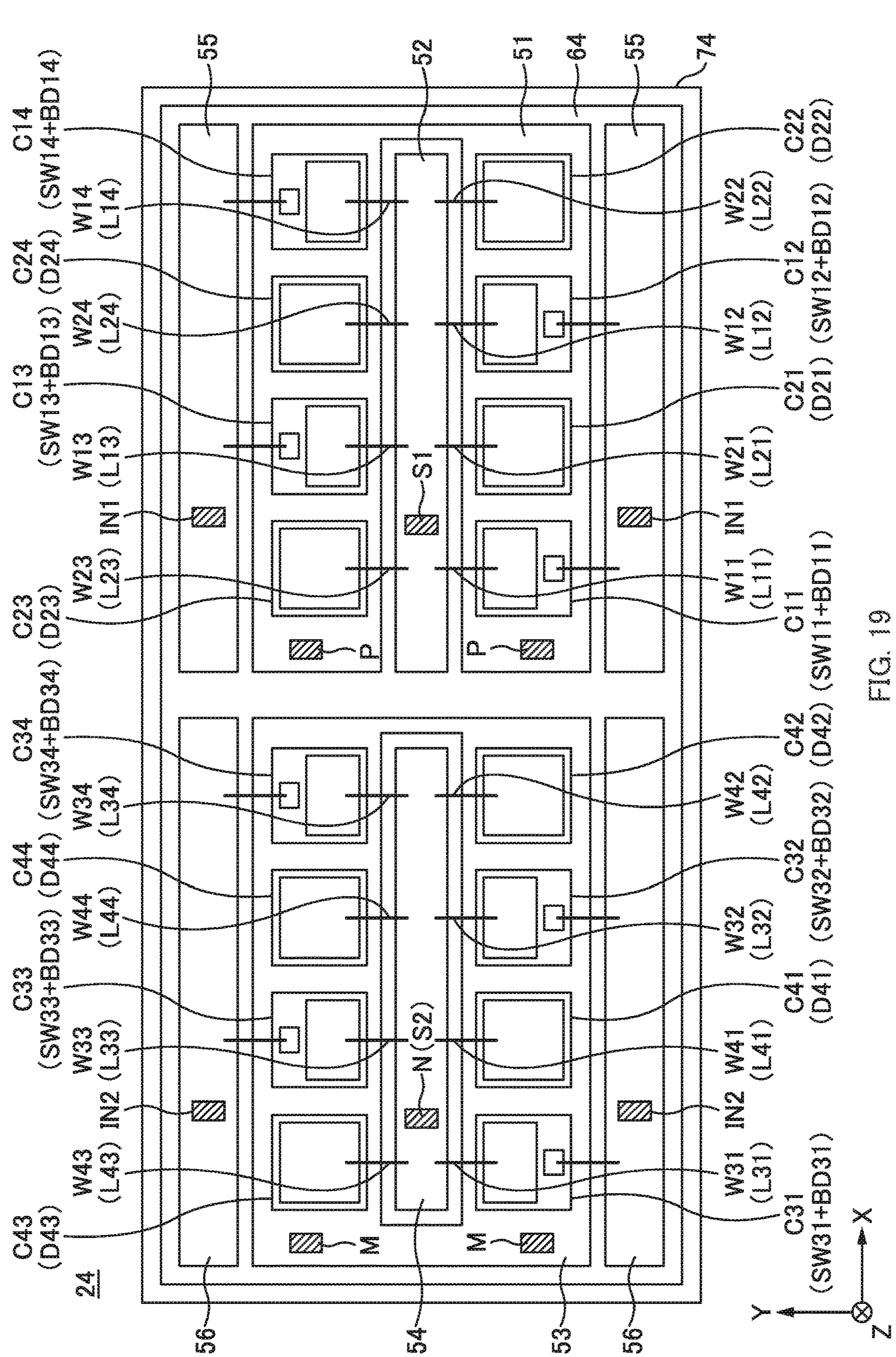
FIG. 19 is a diagram for explaining a configuration of a semiconductor device.

FIG. 19 is a schematic plan view illustrating a configuration of a semiconductor device 24 according to an embodiment of the present disclosure. The semiconductor device 24 according to an embodiment of the present disclosure is an example of a semiconductor device that embodies the electronic circuit 12 of FIG. 17, which is different from the third embodiment.

The semiconductor device 24 of an embodiment of the present disclosure is different from the semiconductor device 23 of the third embodiment, in arrangement of the first to fourth semiconductor chips C1 to C4.

In the semiconductor device 24 according to an embodiment of the present disclosure as well, four first semiconductor chips C11 to C14 and four second semiconductor chips C21 to C24 are arranged in two rows along the x-axis direction in a first conductive pattern 51. One row includes two first semiconductor chips C11 and C12 and two second semiconductor chips C21 and C22. The other row includes two first semiconductor chips C13 and C14 and two second semiconductor chips C23 and C24.

In the semiconductor device 24 according to an embodiment of the present disclosure, the first semiconductor chips C1 and the second semiconductor chips C2 are alternately arranged in each of the two rows. The first semiconductor chip C11 is arranged in one of the two rows on one end side, and the second semiconductor chip C23 is arranged in the other thereof on the one end side.

In other words, in one row, the first semiconductor chip C11, the second semiconductor chip C21, the first semiconductor chip C12, and the second semiconductor chip C22 are arranged in this order. In the other row, the second semiconductor chip C23, the first semiconductor chip C13, the second semiconductor chip C24, and the first semiconductor chip C14 are arranged in this order.

The arrangement of the semiconductor chips in the semiconductor device 24 of an embodiment of the present disclosure can also minimize a difference between an inductance L1*k* and an inductance L2*k* (k=1 to 4), as in the case of the semiconductor device 23 of the third embodiment.

This makes it possible to suppress both an increase in free-wheeling current flowing through the body diode BD1 of the switching device SW1 and a decrease in switching speed of the switching device SW1 can be suppressed.

Furthermore, the first semiconductor chip C1*k* and the second semiconductor chip C2*k* are adjacent to each other in the x-axis direction (k=1 to 4). Accordingly, a difference in length between the first and second wires W1*k* and W2*k* due to manufacturing variations in the x-axis direction can be further suppressed.

This can further suppress the difference between the inductances L1*k* and L2*k* (k=1 to 4).

Furthermore, the first semiconductor chip C11 and the second semiconductor chip C23 are arranged at positions shifted in parallel with each other in the y-axis direction, and the second semiconductor chip C21 and the first semiconductor chip C13 are arranged at positions shifted in parallel with each other in the y-axis direction. This can offset, for example, the difference between the inductances L11 and L21 due to manufacturing variations in the x-axis direction, by the difference between the inductances L13 and L23 due to manufacturing variations in the x-axis direction.

Fifth Embodiment

[Electronic Circuit]

Figure 20:
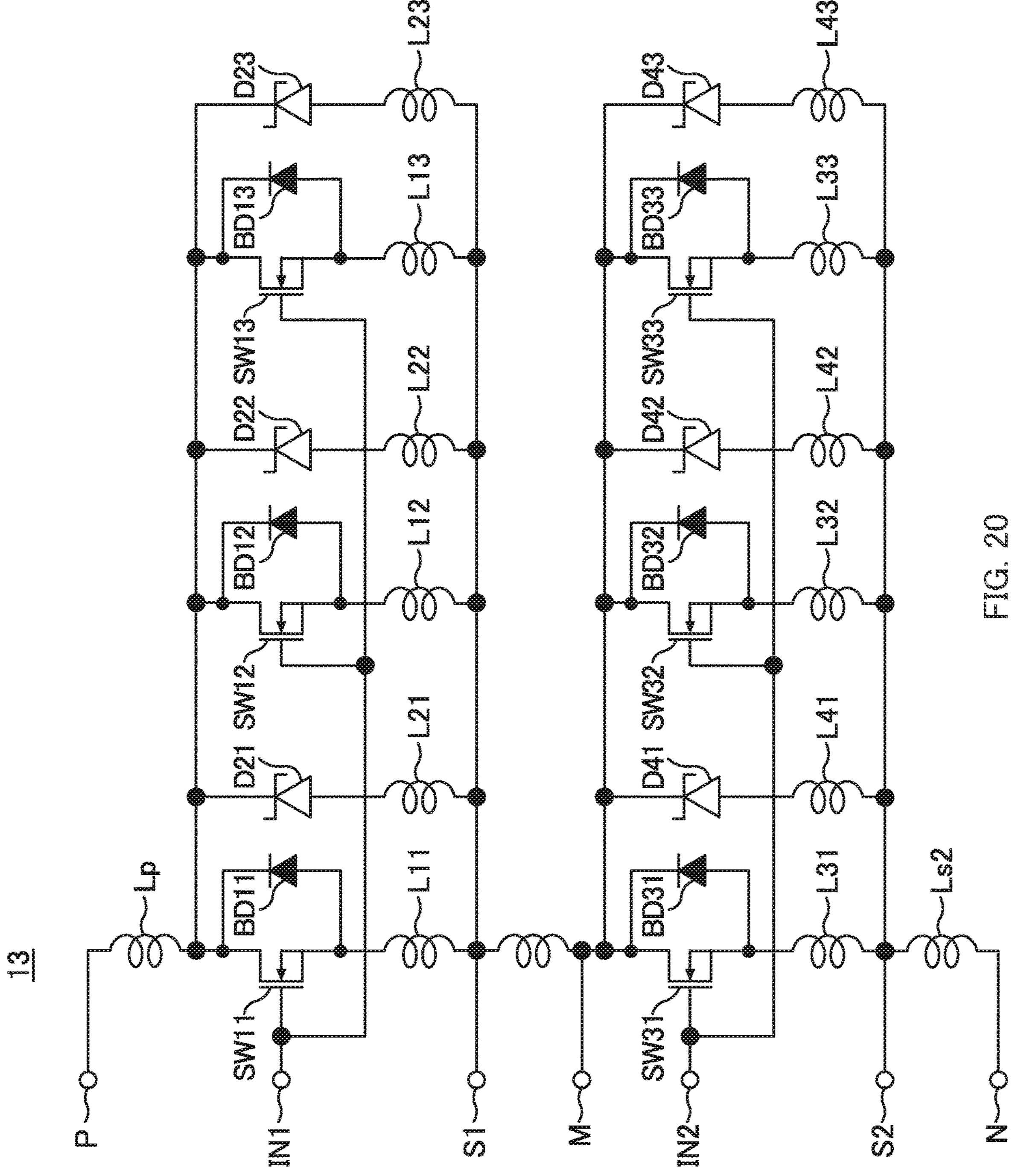
FIG. 20 is a diagram illustrating an electronic circuit.

FIG. 20 is a circuit diagram illustrating an electronic circuit 13 according to an embodiment of the present disclosure. The electronic circuit 13 according to an embodiment of the present disclosure includes three switching devices SW1 and three diode devices D2 in the upper arm. The electronic circuit 13 further includes three switching devices SW3 and three diode devices D4 in its lower arm.

The three switching devices SW1 and the three diode devices D2 in the upper arm are coupled in parallel with each other. The three switching devices SW3 and the three diode devices D4 in the lower arm are coupled in parallel with each other.

[Semiconductor Device]

In the first to fourth embodiments, n (n is 1 or more) first semiconductor chips C1 and n second semiconductor chips C2 are arranged in two rows along the x-axis direction in the upper arm of the semiconductor devices 20, 22, 23, and 24, and the same number of the first semiconductor chips C1 and the second semiconductor chips C2 are included in each of the two rows.

However, the number of the first semiconductor chips C1 and the second semiconductor chips C2 included in one row may be different from the number of those included in the other row. That is, the two rows may each include at least one first semiconductor chip C1 and at least one second semiconductor chip C2.

Figure 21:
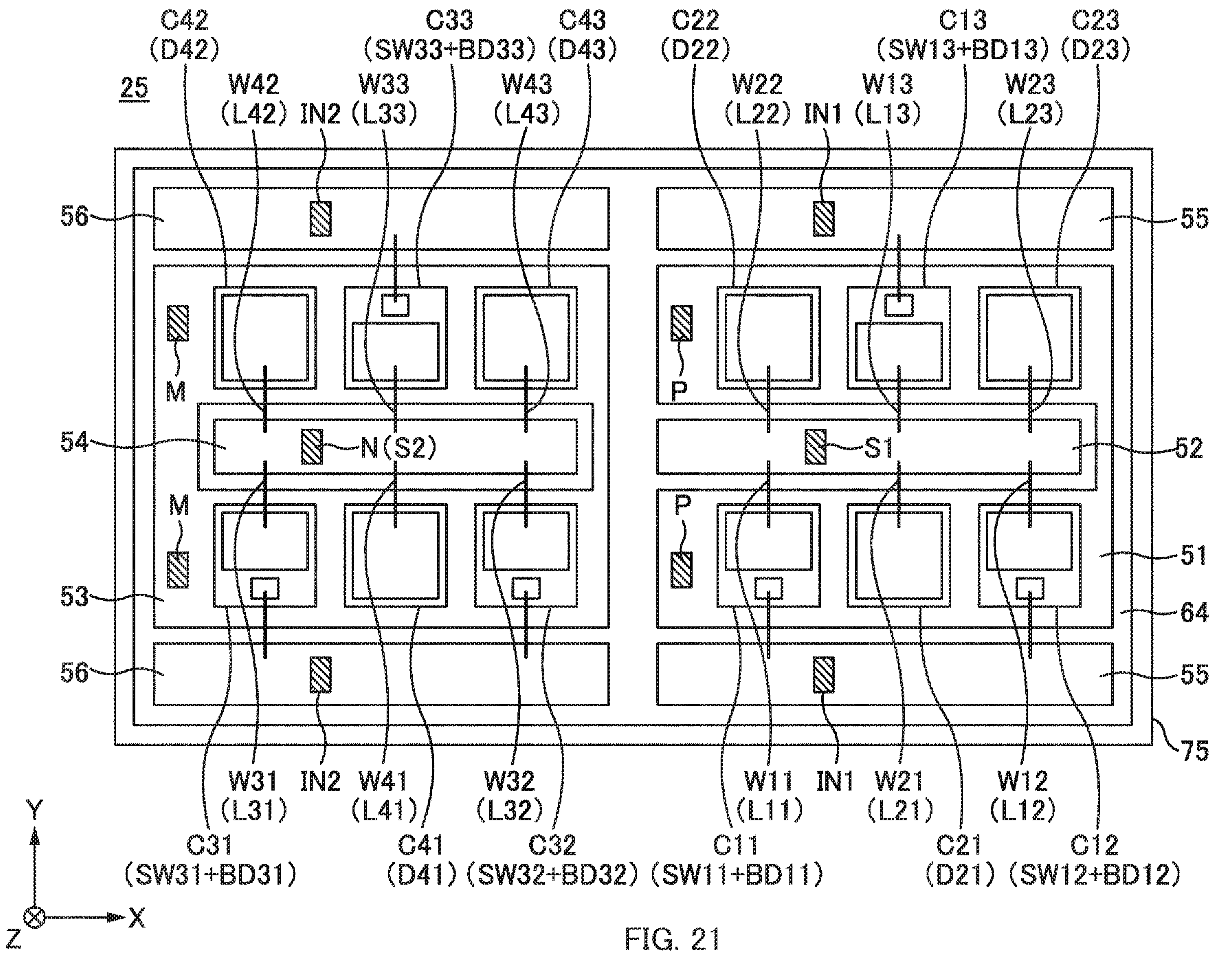
FIG. 21 is a diagram for explaining a configuration of a semiconductor device.

FIG. 21 is a schematic plan view illustrating a semiconductor device 25 according to an embodiment of the present disclosure. In an embodiment of the present disclosure, one row includes two first semiconductor chips C11 and C12 and one second semiconductor chip C21. The other row includes one first semiconductor chip C13 and two second semiconductor chips C22 and C23.

Here, in one row, the first semiconductor chip C11, the second semiconductor chip C21, and the first semiconductor chip C12 are arranged in this order. In the other row, the second semiconductor chip C22, the first semiconductor chip C13, and the second semiconductor chip C23 are arranged in this order.

A first wire W1 couples the source electrode of the first semiconductor chip C1 to the second conductive pattern 52. The first wires W1*l* to W13 correspond to wirings having inductances L11 to L13, respectively.

A second wire W2 couples the anode electrode of the second semiconductor chip C2 to the second conductive pattern 52. The second wires W21 to W23 correspond to wirings having inductances L21 to L23, respectively.

The arrangement of the semiconductor chips in the semiconductor device 25 according to an embodiment of the present disclosure can also minimize a difference between the inductances L11 and L21 and a difference between the inductances L13 and L22, for example.

This makes it possible to suppress both an increase in free-wheeling current flowing through the body diode BD11 of the switching device SW1*l* and a decrease in switching speed of the switching device SW11. Further, this makes it possible to suppress both an increase in free-wheeling current flowing through the body diode BD13 of the switching device SW13 and a decrease in switching speed of the switching device SW13.

In general, the first and second semiconductor chips C1 and C2 are different in size. The configuration of the semiconductor device 25 according to an embodiment of the present disclosure can reduce the area of the semiconductor device 25 as compared to the case where only the first semiconductor chips C1 are arranged in one row and only the second semiconductor chips C2 are arranged in the other row.

Sixth Embodiment

[Electronic Circuit]

Figure 22:
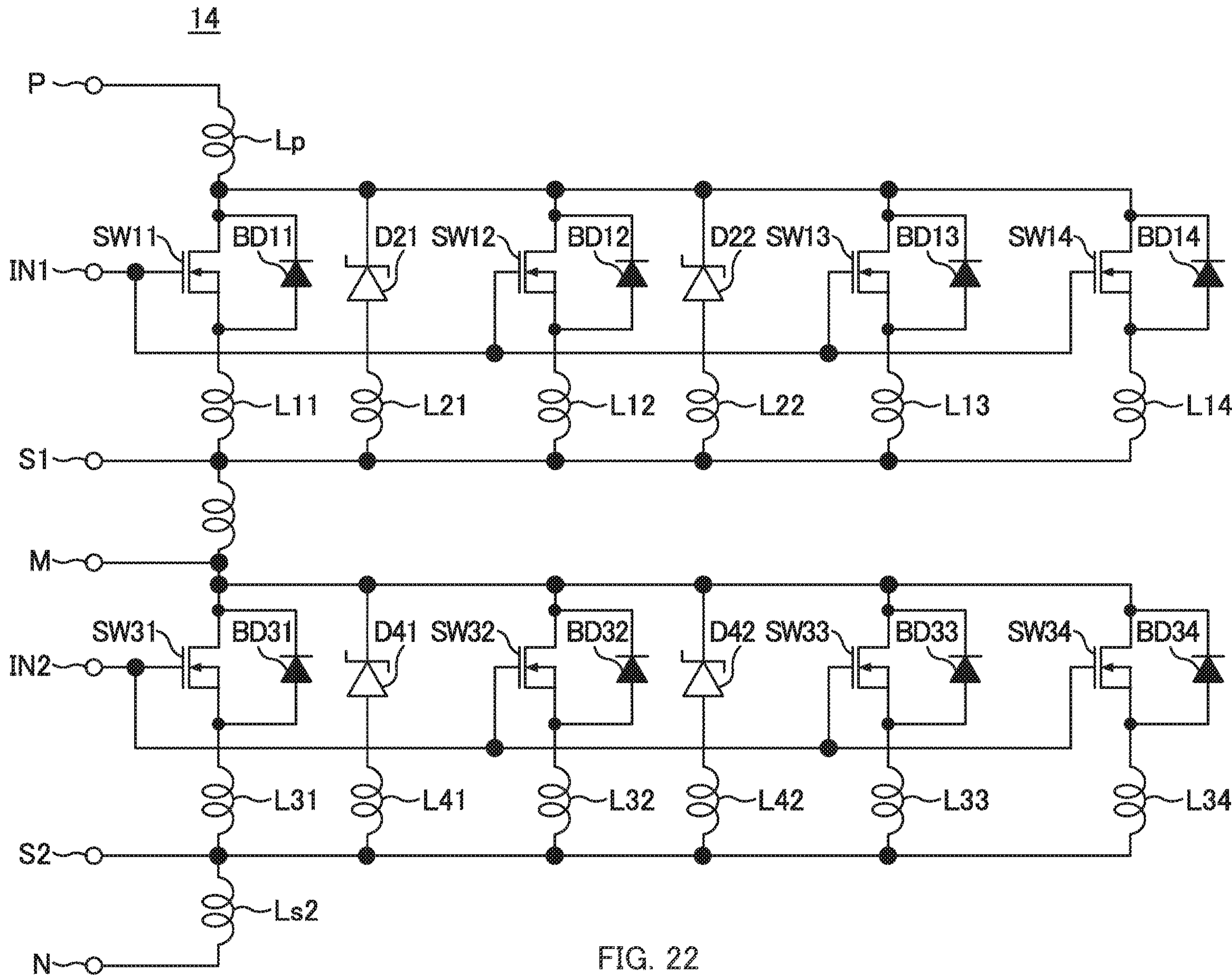
FIG. 22 is a diagram illustrating an electronic circuit.

FIG. 22 is a circuit diagram illustrating an electronic circuit 14 according to an embodiment of the present disclosure. The electronic circuit 14 according to an embodiment of the present disclosure includes four switching devices SW1 and two diode devices D2 in its upper arm. The electronic circuit 14 further includes four switching devices SW3 and two diode devices D4 in its lower arm.

The four upper arm switching devices SW1 and the two upper arm diode devices D2 are coupled in parallel with each other. The four lower arm switching devices SW3 and the two lower arm diode devices D4 are coupled in parallel with each other.

[Semiconductor Device]

In the fifth embodiment, a plurality of (three) semiconductor chips are arranged in two rows along the x-axis direction in the upper arm of the semiconductor device 25, and each of the two rows includes at least one first semiconductor chip C1 and at least one second semiconductor chip C2.

In a semiconductor device 26 according to an embodiment of the present disclosure, the number of first semiconductor chips C1 in one row is equal to the number of first semiconductor chips C1 in the other row. Further, the number of second semiconductor chips C2 in one row is equal to the number of second semiconductor chips C2 in the other row.

Figure 23:
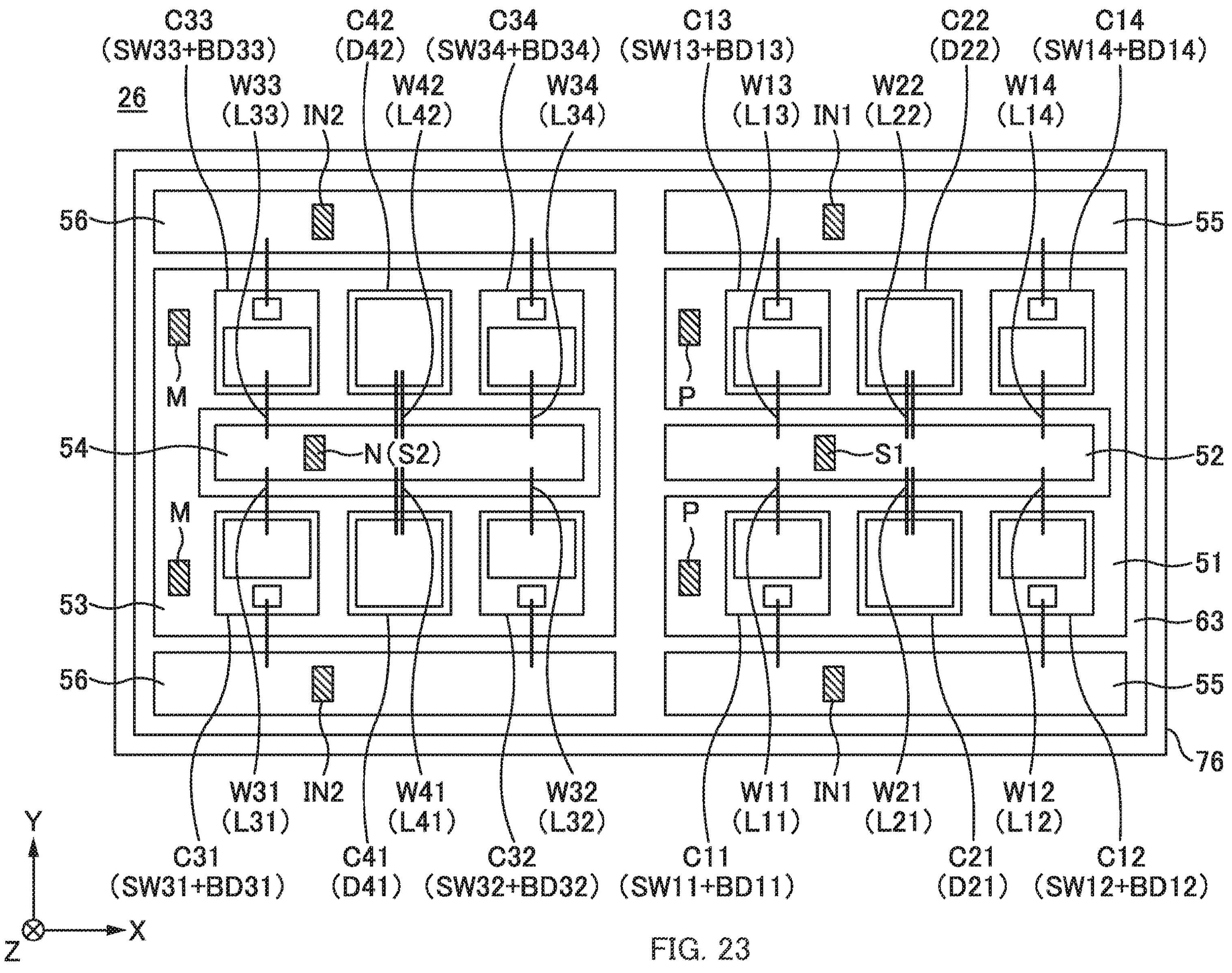
FIG. 23 is a diagram for explaining a configuration of a semiconductor device.

FIG. 23 is a schematic plan view illustrating the semiconductor device 26 according to an embodiment of the present disclosure. In an embodiment of the present disclosure, one row includes two first semiconductor chips C11 and C12 and one second semiconductor chip C21. The other row includes two first semiconductor chips C13 and C14 and one second semiconductor chip C22.

Here, in one row, the first semiconductor chip C11, the second semiconductor chip C21, and the first semiconductor chip C12 are arranged in this order. In the other row, the first semiconductor chip C13, the second semiconductor chip C22, and the first semiconductor chip C14 are arranged in this order.

A first wire W1 couples the source electrode of the first semiconductor chip C1 to the second conductive pattern 52. The first wires W1*l* to W14 correspond to wirings having inductances L11 to L14, respectively.

A second wire W2 couples the anode electrode of the second semiconductor chip C2 to the second conductive pattern 52. The second wires W21 and W22 correspond to wirings having inductances L21 and L22, respectively.

In FIG. 23, for example, the first wire W1*l* is indicated by one line and the second wire W21 is indicated by two lines. This means that the number of the second wires W21 is twice the number of the first wires W1*l*. That is, the design value of the inductance L21 is half the design value of the inductance L11.

The design values of the inductances L12, L13, and L14 are equal to the design value of the inductance L11, and the design value of the inductance L22 is equal to the design value of the inductance L21.

The arrangement of the semiconductor chips in the semiconductor device 26 according to an embodiment of the present disclosure makes it possible to minimize a difference between the inductance L21 and the combined inductance of the inductances L11 and L12, and also to minimize a difference between the inductance L22 and the combined inductance of the inductances L13 and L14.

This makes it possible to suppress both an increase in free-wheeling current flowing through the body diodes BD11 and BD12 of the switching devices SW1*l* and SW12 and a decrease in switching speed of the switching devices SW1*l* and SW12. Further, this makes it possible to suppress both an increase in free-wheeling current flowing through the body diodes BD13 and BD14 of the switching devices SW13 and SW14 and a decrease in switching speed of the switching devices SW13 and SW14.

Note that an embodiment of the present disclosure is further generalized such that, when i (i is an integer) second semiconductor chips C2 and N×i (N is an integer) first semiconductor chips C1 are arranged in one row of each arm, the inductance of each of the plurality of second wires W2 may be set to 1/N of the inductance of each of the plurality of first wires W1. In this case, the number of each of the plurality of second wires W2 may be set to N times the number of the plurality of first wires W1.

Seventh Embodiment

[Semiconductor Device]

Figure 24:
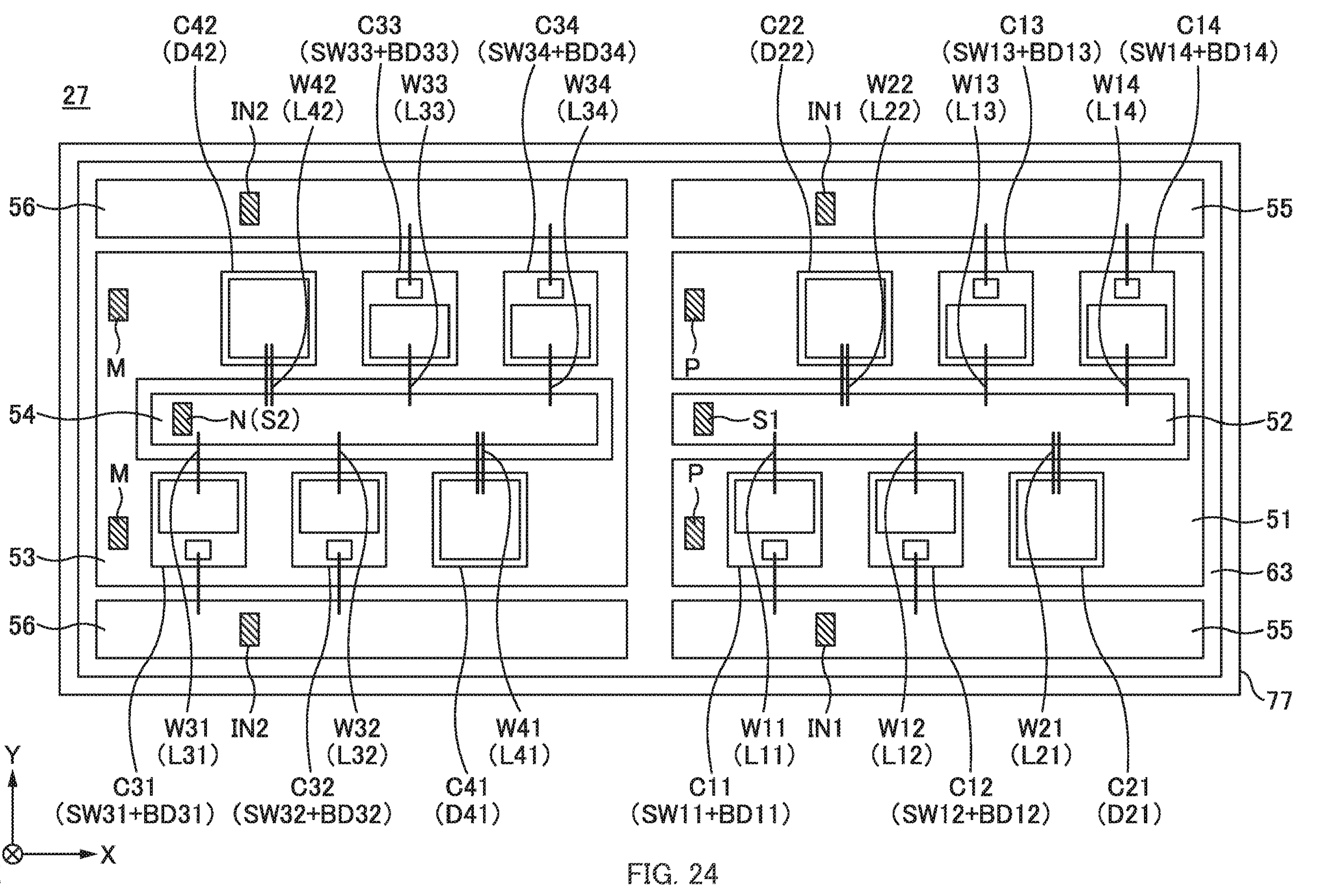
FIG. 24 is a diagram for explaining a configuration of a semiconductor device.

FIG. 24 is a schematic plan view illustrating a semiconductor device 27 according to an embodiment of the present disclosure. The semiconductor device 27 according to an embodiment of the present disclosure is an example of a semiconductor device that embodies the electronic circuit 14 of FIG. 22, which is different from the sixth embodiment.

In an embodiment of the present disclosure, one row of the semiconductor chips arranged in two rows in the upper arm includes two first semiconductor chips C11 and C12 and one second semiconductor chip C21. The other row includes two first semiconductor chips C13 and C14 and one second semiconductor chip C22.

Here, in one row, the first semiconductor chip C11, the first semiconductor chip C12, and the second semiconductor chip C21 are arranged in this order. In the other row, the second semiconductor chip C22, the first semiconductor chip C13, and the first semiconductor chip C14 are arranged in this order.

Furthermore, in an embodiment of the present disclosure, the second semiconductor chip C21 is arranged between the first semiconductor chips C13 and C14 in the x-axis direction. The second semiconductor chip C22 is arranged between the first semiconductor chips C11 and C12 in the x-axis direction.

Accordingly, the three semiconductor chips of the second semiconductor chip C21 and the first semiconductor chips C13 and C14 are arranged on the positive side of the x-axis relative to the three semiconductor chips including the second semiconductor chip C22 and the first semiconductor chips C11 and C12.

The arrangement of the semiconductor chips in the upper arm described above can be rephrased as follows. Two semiconductor chip groups are arranged in the x-axis direction in the upper arm. One (first group) of the two semiconductor chip groups includes the first semiconductor chips C11 and C12 and the second semiconductor chip C22. The other group (second group) includes the first semiconductor chips C13 and C14 and the second semiconductor chip C21. The second group is arranged on the positive side of the x-axis relative to the first group.

In FIG. 24, the first wire W1 is indicated by one line and the second wire W2 is indicated by two lines. That is, the number of each of the plurality of second wires W2 is twice the number of each of the plurality of first wires W1.

The arrangement of the semiconductor chips in the semiconductor device 27 according to an embodiment of the present disclosure makes it possible to minimize a difference in length among the second wire W21 and the first wires W13 and W14 due to manufacturing variations in the x-axis direction. Likewise, the arrangement of the semiconductor chips in the semiconductor device 27 according to an embodiment of the present disclosure makes it possible to minimize a difference in length among the second wire W22 and the first wires W1*l* and W12 due to manufacturing variations in the x-axis direction.

Accordingly, it is possible to minimize a difference between the inductance L21 and the combined inductance of the inductances L13 and L14 due to manufacturing variations in the x-axis direction. Furthermore, it is possible to minimize a difference between the inductance L22 and the combined inductance of the inductances L11 and L12 due to manufacturing variations in the x-axis direction.

This can suppress both an increase in free-wheeling current flowing through the body diodes BD11 and B12 of the switching devices SW11 and SW12 and a decrease in switching speed of the switching devices SW11 and SW12. Further, this makes it possible to suppress both an increase in free-wheeling current flowing through the body diodes BD13 and BD14 of the switching devices SW13 and SW14 and a decrease in switching speed of the switching devices SW13 and SW14.

The arrangement of the semiconductor chips according to an embodiment of the present disclosure can be generalized as follows. A plurality of semiconductor chip groups are arranged in the x-axis direction. The plurality of semiconductor chip groups each include one or more first semiconductor chips C1 and one or more second semiconductor chips C2. In each of the plurality of semiconductor chip groups, the combined inductance of the first wires W1 coupled to the one or more first semiconductor chips C1 is substantially equal to the combined inductance of the second wires W2 coupled to the one or more second semiconductor chips C2.

Such a configuration also makes it possible to suppress both an increase in free-wheeling current flowing through the body diode BD1 of each switching device SW1 and a decrease in switching speed of each switching device SW1.

Summary

As described above, the semiconductor device 23 according to the third embodiment includes: the first conductive pattern 51; the second conductive pattern 52; the first semiconductor chip C1 having a front race and a back face, the first semiconductor chip C1 having the switching device SW1 formed therein, the switching device SW1 having the high-potential electrode in the back face and the low-potential electrode in the front face, the first semiconductor chip C1 being arranged in the first conductive pattern 51; the second semiconductor chip C2 having a front face and a back face, the second semiconductor chip C2 having the diode device D2 formed therein, the diode device D2 having the cathode electrode in the back face and the anode electrode in the front face, the second semiconductor chip C2 being arranged in the first conductive pattern 51; the first wire W1 configured to couple the low-potential electrode and the second conductive pattern 52; and the second wire W2 configured to couple the anode electrode and the second conductive pattern 52, the second wire W2 having a length substantially equal to the length of the first wire W1, wherein the first and second semiconductor chips C1 and C2 are arranged in the first conductive pattern 31 along the first direction, the first and second wires W1 and W2 are parallel to the second direction orthogonal to the first direction, the first direction is a direction parallel to a predetermined side of the first conductive pattern 31, the semiconductor device includes n (n is more than one) first semiconductor chips C1, n second semiconductor chips C2, a plurality of first wires W1, and a plurality of second wires W2, the n first semiconductor chips C1 and the n second semiconductor chips C2 are arranged in two rows along the first direction in the first conductive pattern 51, and each of the two rows includes at least one of the first semiconductor chips and at least one of the second semiconductor chips. The same applies to the fourth to sixth embodiments.

Such a configuration makes it possible to minimize a difference between the inductance L11 of the first wire W1*l* and the inductance L1 of the second wire W21 due to manufacturing variations. This makes it possible to suppress both an increase in free-wheeling current flowing through the switching device SW1 and a decrease in switching speed of the switching device SW1.

Furthermore, such a configuration makes it possible to further suppress the difference between the inductance of the first wire W1 and the inductance of the second wire W2 due to manufacturing variations. This makes it possible to further suppress both an increase in free-wheeling current flowing through the switching device SW1 and a decrease in switching speed of the switching device SW1.

Furthermore, according to such a configuration, the first and second semiconductor chips C1 and C2 can be arranged near the predetermined side along the first direction. Accordingly, the first and second wires W1 and W2 can be reduced in length. This makes it possible to further suppress the difference between the inductance of the first wire W1 and the inductance of the second wire W2 due to manufacturing variations is further suppressed. This makes it possible to further suppress both the increase in free-wheeling current flowing through the switching device SW1 and the decrease in switching speed of the switching device SW1.

Furthermore, such a configuration makes it possible to increase a current capacity of the semiconductor device 23.

Further, in the semiconductor device 20 according to the first embodiment, in the two rows, the number of the first semiconductor chips C1 included in one row of is equal to the number of the first semiconductor chips C1 included in the other row, and the number of the second semiconductor chips C2 included in one row is equal to the number of the second semiconductor chips C2 included in the other row. The same applies to the second to fourth and sixth embodiments.

Such a configuration makes it possible to further suppress both the increase in free-wheeling current flowing through the switching device SW1 and the decrease in switching speed of the switching device SW1.

Further, in the semiconductor device 20 according to the first embodiment, the numbers of the first semiconductor chips C1 and the numbers of the second semiconductor chips C2 included in each of the two rows are the same. The same applies to the second to fourth embodiments.

Such a configuration makes it possible to further suppress both the increase in free-wheeling current flowing through the switching device SW1 and the decrease in switching speed of the switching device SW1.

In the semiconductor device 20 according to the first embodiment, the switching device SW1 is a MOSFET, the high-potential electrode is a drain electrode, and the low-potential electrode is a source electrode. The same applies to the second to fourth embodiments. Such a configuration makes it possible to suppress deterioration of the switching device caused by free-wheeling current flowing through the body diode of the MOSFET.

In the semiconductor device 23 according to the third embodiment, the first semiconductor chip C1 has a body diode formed therein, the body diode having a cathode electrode in the back face and an anode electrode in the front face. The same applies to the second to fourth embodiments. Such a configuration makes it possible to suppress deterioration of the body diode caused by an increase in free-wheeling current flowing through the switching device SW1.

In the semiconductor device 20 according to the first embodiment, a difference in length between the first and second wires W1 and W2 is within the range of manufacturing variations in length of the first and second wires W1 and W2. Such a configuration makes it possible to minimize a difference between the inductance of the first wire W1 and the inductance of the second wire W2 caused by the manufacturing variations. This makes it possible to suppress both an increase in free-wheeling current flowing through the switching device SW1 and a decrease in switching speed of the switching device SW1.

In the semiconductor device 20 according to the first embodiment, manufacturing variations in length of the first and second wires W1 and W2 in the first direction are smaller than manufacturing variations in length of the first and second wires W1 and W2 in the second direction. According to such a configuration, the number of the first semiconductor chips C1 and the number of the second semiconductor chips C2 included in each of the two rows are the same, which makes it possible to suppress both an increase in free-wheeling current flowing through the switching device SW1 included in the first semiconductor chip C1 included in each of the two rows and a decrease in switching speed of the switching device SW1.

In the semiconductor device 24 according to the fourth embodiment, the first and second semiconductor chips C1 and C2 are alternately arranged in each of the two rows. According to such a configuration, since the first and second semiconductor chips C1 and C2 are adjacent to each other in the first direction, it is possible to suppress a difference between the inductances of the first and second wires W1 and W2 adjacent to each other in the first direction caused by manufacturing variations. This makes it possible to further suppress both the increase in free-wheeling current flowing through the switching device SW1 and the decrease in switching speed of the switching device.

In the semiconductor device 24 according to the fourth embodiment, the first semiconductor chip C11 is arranged in one of the two rows, on one end side, and the second semiconductor chip C23 is arranged in the other of the two rows, on the one end side. According to such a configuration, a difference in inductance in one row caused by manufacturing variations in the first direction can be offset by a difference in inductance in the other row caused by manufacturing variations in the first direction.

In the semiconductor device 20 according to the first embodiment, the second conductive pattern 32 has a rectangular shape, the first conductive pattern 31 is formed so as to sandwich at least one side 32*a* along the first direction of the second conductive pattern 32 and the other side 32*b*, and the n first semiconductor chips and the n second semiconductor chips are arranged in the row closer to the one side 32*a* and in the row closer to the other side 32*b* in the first conductive pattern 31. The same applies to the second to fourth embodiments. Such a configuration makes it possible to suppress an increase in the area of the semiconductor device 20.

In the semiconductor device 20 according to the first embodiment, the first conductive pattern 31 has a U shape in top view. The same applies to the third and fourth embodiments. Such a configuration makes it possible to further suppress the increase in the area of the semiconductor device 20.

In the semiconductor device 22 according to the second embodiment, the first conductive pattern 41 has a rectangular shape, the second conductive pattern 42 is formed so as to sandwich at least one side 41*a* along the first direction of the first conductive pattern 41 and the other side 41*b*, and the n first semiconductor chips C1 and the n second semiconductor chips C2 are arranged in the row closer to the one side 41*a* and in the row closer to the other side 41*b* in the first conductive pattern 41. Such a configuration makes it possible to suppress an increase in the area of the semiconductor device 22.

In the semiconductor device 22 according to the second embodiment, the second conductive pattern 42 has a U shape in top view. Such a configuration makes it possible to further suppress an increase in the area of the semiconductor device 22.

In the semiconductor device 20 according to the first embodiment, the switching device SW1 is a MOSFET, the high-potential electrode is a drain electrode, and the low-potential electrode is a source electrode. The same applies to the second to fourth embodiments. Such a configuration makes it possible to suppress deterioration of the switching device caused by free-wheeling current flowing through the body diode of the MOSFET.

In the semiconductor device 20 according to the first embodiment, the first and second semiconductor chips C1 and C2 are SiC substrate chips. The same applies to the second to fourth embodiments. According to such a configuration, when basal plane dislocations exist in SiC, such basal plane dislocation can be prevented from expanding as recombination center.

The semiconductor device 20 according to the first embodiment includes: the third conductive pattern 33 coupled to the second conductive pattern 32; the fourth conductive pattern 34; the third semiconductor chip C3 having the switching device SW3 formed therein, the third semiconductor chip C3 being arranged in the third conductive pattern 33; the fourth semiconductor chip C4 having a diode device formed therein, the fourth semiconductor chip C4 being arranged in the third conductive pattern 33; the third wire W3 coupling the low-potential electrode of the switching device in the third semiconductor chip C3 and the fourth conductive pattern 34; and the fourth wire W4 configured to couple the anode electrode of the diode device in the fourth semiconductor chip C4 and the fourth conductive pattern 34, the fourth wire W4 having a length substantially equal to the length of the third wire W3. Such a configuration realizes a half-bridge circuit capable of suppressing both an increase in free-wheeling current flowing through the switching devices SW1 and SW3 and a decrease in switching speed of the switching devices SW1 and SW3.

The present disclosure is directed to provision of a semiconductor device capable of suppressing both an increase in free-wheeling current flowing through a switching device and a decrease in switching speed of the switching device.

According to the present disclosure, it is possible to provide a semiconductor device capable of suppressing both an increase in free-wheeling current flowing through a switching device and a decrease in switching speed of the switching device.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A semiconductor device comprising:
- a first conductive pattern;
- a second conductive pattern;
- a third conductive pattern;
- a fourth conductive pattern;
- a plurality of first semiconductor chips, each first semiconductor chip having
  - a front face,
  - a back face that is coupled to the first conductive pattern, and
  - a switching device formed in said each first semiconductor chip, the switching device having a high-potential electrode at the back face and a low-potential electrode at the front face;
- a plurality of second semiconductor chips, each second semiconductor chip having
  - a front face,
  - a back face that is coupled to the first conductive pattern, and
  - a diode device formed in said each second semiconductor chip, the diode device having a cathode electrode at the back face thereof and an anode electrode at the front face thereof;

a plurality of first wires, respectively coupling the low-potential electrodes of the plurality of switching devices and the second conductive pattern; and a plurality of second wires, respectively coupling the anode electrodes of the plurality of diode devices and the second conductive pattern, each of the plurality of second wires having a length substantially equal to a length of each of the plurality of first wires, wherein the plurality of first semiconductor chips and the plurality of second semiconductor chips are arranged on the first conductive pattern in two rows that includes a first row and a second row, each row being in a first direction and including at least one of the plurality of first semiconductor chips and at least one of the plurality of second semiconductor chips, the first direction being parallel to a predetermined side of the first conductive pattern, the plurality of first wires and the plurality of second wires are each in a second direction orthogonal to the first direction, each of the plurality of first semiconductor chips in the first row has a control electrode that is connected, via a third wire, to the third conductive pattern, each of the plurality of first semiconductor chips in the second row has a control electrode that is connected, via a fourth wire, to the fourth conductive pattern, and in a plan view, the first and second conductive patterns are located between the third conductive pattern and the fourth conductive pattern.

2. The semiconductor device according to claim 1, wherein a same number of the first semiconductor chips are in each of the two rows, where said same number is a first number, and a same number of the second semiconductor chips are in each of the two rows, where said same number is a second number.

3. The semiconductor device according to claim 2, wherein the first number is equal to the second number.

4. The semiconductor device according to claim 1, wherein each of the switching devices is a metal-oxide-semiconductor field-effect transistor (MOSFET), wherein the high-potential electrode is a drain electrode, and the low-potential electrode is a source electrode.

5. The semiconductor device according to claim 1, wherein each of the first semiconductor chips has a body diode formed therein, the body diode having a cathode electrode thereof at the back face of said each first semiconductor chip, and an anode electrode thereof at the front face of said each first semiconductor chip.

6. The semiconductor device according to claim 1, wherein a difference in length between each of the plurality of first wires and each of the plurality of second wires is within a range of manufacturing variations.

7. The semiconductor device according to claim 6, wherein the manufacturing variations are smaller in the first direction than in the second direction.

8. The semiconductor device according to claim 1, wherein the first and second semiconductor chips are alternately arranged in each of the two rows.

9. The semiconductor device according to claim 8, wherein one of the plurality of first semiconductor chips and one of the plurality of second semiconductor chip are respectively arranged in the two rows on a same end side thereof.

10. The semiconductor device according to claim 1, wherein the second conductive pattern has a rectangular shape, and the first conductive pattern is so shaped as to sandwich the second conductive pattern from two opposite sides along the first direction of the second conductive pattern, and the plurality of first semiconductor chips and the plurality of second semiconductor chips are arranged on the first conductive pattern in the two rows respectively closer to the two opposite sides.

11. The semiconductor device according to claim 10, wherein the first conductive pattern has a U shape in a top view of the semiconductor device.

12. The semiconductor device according to claim 1, wherein the first conductive pattern has a rectangular shape, and the second conductive pattern is so shaped as to sandwich the first conductive pattern from two opposite sides along the first direction of the first conductive pattern, and the plurality of first semiconductor chips and the plurality of second semiconductor chips are arranged on the first conductive pattern in the two rows respectively closer to the two opposite sides.

13. The semiconductor device according to claim 12, wherein the second conductive pattern has a U shape in a top view of the semiconductor device.

14. The semiconductor device according to claim 1, wherein the first semiconductor chip, or the second semiconductor chip, or both, is a SiC substrate chip.

15. The semiconductor device according to claim 1, wherein the third conductive pattern is coupled to the second conductive pattern; and the semiconductor device further includes:

a third semiconductor chip having another switching device formed therein, the third semiconductor chip being arranged in the third conductive pattern, a fourth semiconductor chip having another diode device formed therein, the fourth semiconductor chip being arranged in the third conductive pattern, another wire coupling a low-potential electrode of said another switching device in the third semiconductor chip and the fourth conductive pattern, and yet another wire coupling an anode electrode of said another diode device in the fourth semiconductor chip and the fourth conductive pattern, the yet another wire having a length substantially equal to a length of the another wire.

* * * * *